(12) United States Patent
Budach et al.

(10) Patent No.: US 11,256,168 B2
(45) Date of Patent: Feb. 22, 2022

(54) APPARATUS AND METHOD FOR REPAIRING A PHOTOLITHOGRAPHIC MASK

(71) Applicant: Carl Zeiss SMT GmbH, Oberkochen (DE)

(72) Inventors: Michael Budach, Hanau (DE); Ottmar Hoinkis, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/775,719

(22) Filed: Jan. 29, 2020

(65) Prior Publication Data

US 2020/0249564 A1 Aug. 6, 2020

(30) Foreign Application Priority Data

Feb. 5, 2019 (DE) .......................... 102019201468.2

(51) Int. Cl.
*G03F 1/74* (2012.01)
*G03F 7/20* (2006.01)
(Continued)

(52) U.S. Cl.
CPC ............... *G03F 1/74* (2013.01); *G03F 1/86* (2013.01); *G03F 7/2043* (2013.01);
(Continued)

(58) Field of Classification Search
CPC . G03F 1/74; G03F 1/86; G03F 7/2043; G03F 7/70058; H01J 37/00;
(Continued)

(56) References Cited

U.S. PATENT DOCUMENTS 5,656,811 A 8/1997 Itoh et al.
6,303,932 B1 * 10/2001 Hamamura ............. H01J 37/28
250/397

(Continued)

FOREIGN PATENT DOCUMENTS

CN 108873623 11/2018 ............ G03F 7/20
EP 3257973 12/2017 ............ C25F 3/06

(Continued)

OTHER PUBLICATIONS

German Office Action for German Application No. DE 10 2019 201 468.2 dated Sep. 25, 2019.

(Continued)

*Primary Examiner* — David E Smith
(74) *Attorney, Agent, or Firm* — Fish & Richardson P.C.

(57) ABSTRACT

The present application relates to an apparatus for processing a photolithographic mask, said apparatus comprising: (a) at least one time-varying particle beam, which is embodied for a local deposition reaction and/or a local etching reaction on the photolithographic mask; (b) at least one first means for providing at least one precursor gas, wherein the precursor gas is embodied to interact with the particle beam during the local deposition reaction and/or the local etching reaction; and (c) at least one second means, which reduces a mean angle of incidence ($\varphi$) between the time-varying particle beam and a surface of the photolithographic mask.

16 Claims, 15 Drawing Sheets

(51) Int. Cl.

| | |
|---|---|
| *H01J 37/317* | (2006.01) |
| *H01J 37/302* | (2006.01) |
| *H01J 37/305* | (2006.01) |
| *G03F 1/86* | (2012.01) |
| *H01J 37/00* | (2006.01) |
| *H01J 37/20* | (2006.01) |
| *H01J 37/147* | (2006.01) |

(52) U.S. Cl.
CPC .......... *G03F 7/70058* (2013.01); *H01J 37/00* (2013.01); *H01J 37/1472* (2013.01); *H01J 37/1478* (2013.01); *H01J 37/20* (2013.01); *H01J 37/302* (2013.01); *H01J 37/3053* (2013.01); *H01J 37/3178* (2013.01); *H01J 2237/1506* (2013.01); *H01J 2237/30472* (2013.01); *H01J 2237/31732* (2013.01); *H01J 2237/31742* (2013.01); *H01J 2237/31744* (2013.01)

(58) Field of Classification Search
CPC .... H01J 37/1472; H01J 37/1478; H01J 37/20; H01J 37/302; H01J 37/3053; H01J 37/3178; H01J 2237/1506; H01J 2237/30472; H01J 2237/31732; H01J 2237/31742; H01J 2237/31744
See application file for complete search history.

(56) References Cited

U.S. PATENT DOCUMENTS

| | | | |
|---|---|---|---|
| 9,530,674 B2 | 12/2016 | Yieh et al. | |
| 2001/0010362 A1* | 8/2001 | Simizu | B82Y 40/00 250/396 R |
| 2001/0027917 A1* | 10/2001 | Ferranti | G03F 1/74 430/5 |
| 2003/0000921 A1* | 1/2003 | Liang | G03F 1/72 216/59 |
| 2004/0084408 A1* | 5/2004 | Makarov | H01L 21/32136 216/62 |
| 2004/0151991 A1* | 8/2004 | Stewart | G03F 1/74 430/5 |
| 2005/0035306 A1 | 2/2005 | Iwasaki | |
| 2008/0258060 A1* | 10/2008 | Frosien | H01J 37/28 250/310 |
| 2011/0210181 A1 | 9/2011 | Edinger et al. | |
| 2012/0217590 A1 | 8/2012 | Babich et al. | |
| 2012/0235055 A1 | 9/2012 | Madokoro et al. | |
| 2013/0248707 A1* | 9/2013 | Man | H01J 37/28 250/307 |
| 2014/0170776 A1 | 6/2014 | Satoh et al. | |
| 2018/0226221 A1* | 8/2018 | Danilatos | H01J 37/1472 |
| 2018/0286628 A1 | 10/2018 | Hasuda | |
| 2019/0311877 A1* | 10/2019 | Willis | H01J 37/244 |

FOREIGN PATENT DOCUMENTS

| | | | | |
|---|---|---|---|---|
| JP | | H01-107257 | 4/1989 | ............ G03F 1/00 |
| JP | | H10-162769 | 6/1998 | ............ H01J 37/30 |
| JP | | 2004-071486 | 3/2004 | ............ H01J 37/20 |
| JP | | 2004-294613 | 10/2004 | ............ G03F 1/08 |
| JP | | 2011-508943 | 3/2011 | ............ H01J 37/305 |
| KR | | 1020180109688 | 10/2018 | ............ G03F 1/20 |
| TW | | 200737268 | 10/2007 | ............ C23C 14/48 |
| TW | | 201809863 | 3/2018 | ............ G03F 7/00 |
| WO | WO | 2007/067313 | 6/2007 | ............ H01J 9/02 |
| WO | WO | 2014/202585 | 12/2014 | ............ H01S 3/09 |
| WO | WO | 2017/211545 | 12/2017 | ............ G03F 7/20 |

OTHER PUBLICATIONS

Taiwan Office Action and Search Report for Taiwan Application No. TW 109101369 dated Dec. 4, 2020 (With English Translation).
Notice of Reasons for Rejection from the Korean Intellectual Property Office for Korean Application No. KR 10-2020-0013768 dated Feb. 15, 2021 (English Language Translation).
Notification of Reasons for Refusal issued by the Japanese Patent Office for Japanese Application No. 2020-017742, dated May 10, 2021 (English Translation).
Second Office Action and Search issued by the Taiwan Intellectual Patent Office for Taiwan Application No. TW 109101369, dated Aug. 13, 2021 (with English Translation).

* cited by examiner

APPARATUS AND METHOD FOR REPAIRING A PHOTOLITHOGRAPHIC MASK

CROSS-REFERENCE TO RELATED APPLICATIONS

The present application claims the priority of the German patent application DE 10 2019 201 468.2, which was filed on Feb. 5, 2019 at the German Patent and Trade Mark Office and which, in the entirety thereof, is incorporated in the present application by reference.

TECHNICAL FIELD

The present description relates to an apparatus and a method for repairing a photolithographic mask.

BACKGROUND

As a consequence of the growing integration density in the semiconductor industry, photolithographic masks have to image increasingly smaller structures on wafers. One option of accommodating this trend lies in the use of photolithographic masks whose actinic wavelength is shifted to ever shorter wavelengths. Currently, ArF (argon fluoride) excimer lasers that emit at a wavelength of approximately 193 nm are frequently used in photolithography as light sources.

Lithography systems are being developed today that use electromagnetic radiation in the EUV (extreme ultraviolet) wavelength range (preferably in the range of 10 nm to 15 nm). Said EUV lithography systems are based on a completely new beam guiding concept which uses reflective optical elements, since no materials are currently available that are optically transparent in the stated EUV range. The technological challenges in developing EUV systems are enormous, and tremendous development efforts are necessary to bring said systems to a level where they are ready for industrial application.

A significant contribution to the imaging of ever smaller structures in the photoresist disposed on a wafer is due to photolithographic masks, exposure masks, photomasks or just masks. With every further increase in integration density, it becomes increasingly more important to reduce the minimum structure size of the exposure masks. The production process of photolithographic masks therefore becomes increasingly more complex and as a result more time-consuming and ultimately also more expensive. Due to the minute structure sizes of the pattern elements, defects during mask production cannot be ruled out. These must be repaired—whenever possible.

Currently, mask defects are frequently repaired by electron beam-induced local deposition and/or etching processes. The demands on the repair processes are ever more challenging on account of the reducing structure sizes of the pattern elements. On account of the structure elements decreasing in size, it is necessary for the edge slope of the structures produced by use of the repair processes to approximate the reference structures predetermined by the design ever more closely. This problem equally applies to the repair of defects of templates that are used in nanoimprint lithography (NIL).

The exemplary documents specified below describe how narrow holes on wafers are filled or how specimens for transmission electron microscopy are produced with the aid of a focused ion beam: US 2012/0217590 A1, US 2014/0170776 A1, U.S. Pat. No. 9,530,674 B2, U.S. Pat. No. 5,656,811 and US 2012/0235055 A1.

The present invention addresses the problem of specifying an apparatus and a method that facilitate an improvement in the repair of photolithographic masks and/or of templates for nanoimprint lithography.

SUMMARY

According to one exemplary embodiment of the present invention, this problem is solved by an apparatus and by a method described below. In one embodiment, the apparatus for processing a photolithographic mask comprises: (a) at least one time-varying particle beam, which is embodied for a local deposition reaction and/or a local etching reaction on the photolithographic mask; (b) at least one first means for providing at least one precursor gas, wherein the precursor gas is embodied to interact with the particle beam during the local deposition reaction and/or the local etching reaction; and (c) at least one second means, which reduces a mean angle of incidence between the time-varying particle beam and a surface of the photolithographic mask.

By reducing the mean angle of incidence on the surface of a photolithographic mask of a particle beam which triggers a local deposition or etching reaction, it is possible to increase, with respect to the surface of the photolithographic mask, an edge slope of a structure to be etched and/or to be deposited, i.e., said edge slope can be brought into a better correspondence with the angle of 90°, which is typically predetermined by the design. Further, the reduction of the mean angle of incidence of the particle beam on the surface of the photolithographic mask facilitates the generation of repaired sites, the curve radius of which substantially does not deviate from the curve radius of corresponding defect-free sites of the photolithographic mask. Moreover, reducing the mean angle of incidence of the particle beam on the surface of the photolithographic mask minimizes the damage to the photolithographic mask that is generated in the surroundings of a site to be repaired by carrying out a local repair process.

Typically, a particle beam senses a scan region of a photomask or, in general, of a specimen by virtue of the particle beam being scanned line-by-line over the scan region. There is a minor change in the angle of incidence of the particle beam on the surface of the specimen while a line is scanned. The reduction in the angle of incidence on the surface of a photolithographic mask specified under point (c) above does not refer to this change in angle of the particle beam during a line scan or, in general, during the sensing of a scan region. The term "mean angle of incidence" is introduced to distinguish the above-defined reduction in the angle of incidence from the change in angle of incidence during a line scan. Said term describes the mean angle at which a particle beam is incident on a specimen during a line scan. By way of example, the mean angle of incidence can be defined as the arithmetic mean over all angles of incidence of a line scan or, in general, of a scan region of the particle beam.

Here and elsewhere in this description, the expression "substantially" denotes an indication of a measured quantity within the conventional measurement errors if measuring appliances according to the prior art are used to determine the measured quantity.

In this application, the term "photolithographic mask" likewise comprises a template for nanoimprint lithography.

Typically, a photolithographic mask comprises a substrate with pattern elements disposed thereon or with pattern elements etched into the substrate. In this application, the surface of the photolithographic mask is understood to mean a region of a surface of a photomask, said region having no structure elements that image the incident light.

The second means may comprise at least one element from the group of: a tilt apparatus for tilting the photolithographic mask relative to the particle beam; a pivot apparatus of a beam source for tilting the particle beam relative to the photolithographic mask; and at least one deflection apparatus for particles of the particle beam, for reducing the mean angle of incidence of the particle beam on the photolithographic mask.

The pivot apparatus of the beam source can comprise the realization of a fixed angle, which differs from 90°, between the particle beam of the beam source and a specimen stage of the apparatus for processing a photolithographic mask.

Naturally, the second means could also comprise more than one of the above-listed apparatuses and the reduction in the mean angle of incidence could be carried out by an interaction of two or three of the specified apparatuses.

The second means can be embodied to rotate the reduced angle of incidence of the time-varying particle beam about the optical axis of the photolithographic mask.

Under the assumption that the optical axis of the photolithographic mask is parallel to the z-axis of a coordinate system, the second means is always embodied to change, i.e., to increase, a polar angle between the particle beam and the optical axis. By virtue of the second means also facilitating a change in the azimuth angle in addition to a change in the polar angle, the improved processing of the photolithographic mask by use of a local deposition or etching reaction can be carried out at any site or on any side of a pattern element of the photomask.

The deflection apparatus may comprise at least one element from the group of: an electrical deflection system and a magnetic deflection system.

A combination of an electrical and a magnetic deflection system is likewise possible. Here, an electrical deflection system can deflect the particle beam in a first direction and the magnetic deflection system can deflect the particle beam in a second direction. However, the electrical and the magnetic deflection system could also deflect the particle beam in the same direction and thus amplify each other's effect on the particle beam.

Further, the deflection apparatus can be embodied to deflect the particle beam in two directions. The two deflection directions of the deflection apparatus can have an angle of substantially 90° with respect to one another.

The deflection apparatus might be part of the beam source of the particle beam. The deflection apparatus might not be part of the beam source of the particle beam. If the deflection apparatus is part of the beam source of the particle beam and the beam source comprises a scanning electron microscope, for example, the deflection apparatus may be disposed in a column of the scanning electron microscope. Should the deflection apparatus not be part of the beam source of the particle beam and the beam source comprise a scanning electron microscope, the deflection apparatus may be disposed outside of the column of the scanning electron microscope.

However, both the electrical and magnetic deflection system could also be part of the beam source of the particle beam. Thus, for example, the electrical deflection system can be disposed upstream of an electron optical lens of the beam source and the magnetic deflection system can be disposed downstream of an electron optical lens of the beam source.

The electrical deflection system may comprise at least one deflection plate pair. The electrical deflection system may comprise at least two deflection plate pairs, which are disposed parallel to one another. The electrical deflection system may be disposed upstream of an electron optical objective lens of the beam source for the particle beam.

The magnetic deflection system may comprise at least one coil arrangement. The at least one coil arrangement may comprise at least one coil pair. However, the magnetic deflection system may also comprise at least one or more permanent magnets.

The tilt apparatus may comprise a specimen stage for the photolithographic mask, said specimen stage being rotatable about at least two axes, and the two axes might lie in a plane of the photolithographic mask and might be not parallel to one another. The two axes of rotation of the specimen stage being perpendicular to one another is advantageous.

The specimen stage may be rotatable about a third axis, wherein the third axis of rotation of the specimen stage is substantially parallel to the optical axis of the photolithographic mask. A combination of a second means, which reduces the mean angle of incidence of the time-varying particle beam on the surface of the photolithographic mask in one direction, and a specimen stage that is rotatable about the optical axis of the photolithographic masks allows the mean angle of incidence of the time-varying particle beam to be adjusted in two spatial directions. This provides access to any processing location on the photolithographic mask.

The second means can reduce the mean angle of incidence between the time-varying particle beam and the surface of the photolithographic mask by >5°, preferably >10°, more preferably >20° and most preferably >30°.

At the point of incidence on the photolithographic mask, the particle beam may have a focal diameter of 0.1 nm to 1000 nm, preferably 0.2 nm to 200 nm, more preferably 0.4 nm to 50 nm and most preferably 0.5 nm to 2 nm.

The particle beam may have an aperture angle of 0.1 mrad to 1000 mrad, preferably 0.2 mrad to 700 mrad, more preferably 0.5 mrad to 500 mrad and most preferably 1 mrad to 200 mrad. Here, "mrad" denotes milliradians.

The kinetic energy of the particles of a particle beam may comprise a range of 0.01 keV to 500 keV, preferably 0.05 keV to 200 keV, more preferably 0.1 keV to 50 keV and most preferably 0.1 keV to 1 keV.

A time-varying particle beam may comprise a particle beam that scans over a scan region of the photolithographic mask. Scanning of a particle beam can be characterized by the parameters of dwell time and repetition time.

However, a time-varying particle beam may also comprise a particle beam in which the kinetic energy of its particles and/or the focal diameter of the particle beam experience a temporal change.

The apparatus for processing a photolithographic mask may further comprise an evaluation unit, which is embodied to analyze scan data of a site to be processed on the photolithographic mask. In particular, the evaluation unit can produce image data from the scan data. The image data can be stored and/or displayed on a monitor.

Further, the evaluation unit can be embodied to determine at least one change in the mean angle of incidence of the particle beam on the surface of the photolithographic mask from the analyzed scan data.

The evaluation unit can be embodied to determine the reduction in the mean angle of incidence of the particle beam from the kinetic energy of the particle beam for carrying out the local etching reaction and/or the local deposition reaction. Moreover, the evaluation unit can be embodied to determine the reduction in the mean angle of incidence of the particle beam from a material composition of the material to be deposited and/or to be etched. Further, the evaluation unit can be embodied to set the mean angle of incidence of the particle beam on the basis of the scan data.

The kinetic energy of the particles of the particle beam and the material composition on which the particles of the particle beam strike influence the size of the interaction region of the particle beam with the photolithographic mask and hence influence the area of the mask that may be processed or might be impaired by carrying out a local deposition process or a local etching process.

Further, the evaluation unit can be embodied to determine an area and a material composition for a protective layer around a processing site.

The apparatus for processing a photolithographic mask may further comprise a control apparatus, which is embodied to control the second means for changing the mean angle of incidence of the particle beam on the surface of the photolithographic mask.

The first means may comprise at least one element from the group of: at least one supply container, which is embodied to store the at least one precursor gas, at least one control valve, which is embodied to control a gas mass flow of the at least one precursor gas, at least one gas line system, which is embodied to guide the at least one precursor gas from the at least one supply container to the point of incidence of the particle beam on the photolithographic mask, and at least one nozzle, which is embodied to concentrate the precursor gas at the point of incidence of the particle beam on the surface of the photolithographic mask.

The at least one precursor gas may comprise at least one element from the group of: at least one etching gas, at least one deposition gas and at least one additive gas.

The at least one etching gas may comprise at least one halogen-containing compound. A halogen-containing compound may comprise at least one element from the group of: Fluorine ($F_2$), chlorine ($Cl_2$), bromine ($Br_2$), iodine ($I_2$), xenon difluoride ($XeF_2$), xenon tetrafluoride ($XeF_4$), xenon hexafluoride ($XeF_6$), xenon chloride (XeCl), argon fluoride (ArF), krypton fluoride (KrF), sulfur difluoride ($SF_2$), sulfur tetrafluoride ($SF_4$), sulfur hexafluoride ($SF_6$), phosphorus trifluoride ($PF_3$), and phosphorus pentafluoride ($PF_5$).

The at least one deposition gas may comprise at least one element from the group of: a metal alkyl, a transition element alkyl, a main group alkyl, a metal carbonyl, a transition element carbonyl, a main group carbonyl, a metal alkoxide, a transition element alkoxide, a main group alkoxide, a metal complex, a transition element complex, a main group complex and an organic compound.

The metal alkyl, the transition element alkyl and the main group alkyl may comprise at least one element from the group of: Cyclopentadienyl (Cp) trimethyl platinum ($CpPtMe_3$), methylcyclopentadienyl (MeCp) trimethyl platinum ($MeCpPtMe_3$), tetramethyltin ($SnMe_4$), trimethylgallium ($GaMe_3$), ferrocene ($Co_2Fe$) and bisarylchromium ($Ar_2Cr$). The metal carbonyl, the transition element carbonyl and the main group carbonyl may comprise at least one element from the group of: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$) and iron pentacarbonyl ($Fe(CO)_5$). The metal alkoxide, the transition element alkoxide and the main group alkoxide may comprise at least one element from the group of: tetraethyl orthosilicate (TEOS, $Si(OC_2H_5)_4$) and tetraisopropoxytitanium ($Ti(OC_3H_7)_4$). The metal halide, the transition element halide and the main group halide may comprise at least one element from the group of: tungsten hexafluoride ($WF_6$), tungsten hexachloride ($WCl_6$), titanium hexachloride ($TiCl_6$), boron trichloride ($BCl_3$) and silicon tetrachloride ($SiCl_4$). The metal complex, the transition element complex and the main group complex may comprise at least one element from the group of: copper bis(hexafluoroacetylacetonate) ($Cu(C_5F_6H_4O_2)_2$) and dimethylgold trifluoroacetylacetonate ($Me_2Au(C_5F_3H_4O_2)$). The organic compound may comprise at least one element from the group of: Carbon monoxide (CO), carbon dioxide ($CO_2$), an aliphatic hydrocarbon, an aromatic hydrocarbon, a constituent of vacuum pump oils and a volatile organic compound.

The at least one additive gas may comprise at least one element from the group of: an oxidation agent, a halide and a reducing agent.

The oxidation agent may comprise at least one element from the group of: oxygen ($O_2$), ozone ($O_3$), water vapor ($H_2O$), hydrogen peroxide ($H_2O_2$), dinitrogen oxide ($N_2O$), nitrogen oxide (NO), nitrogen dioxide ($NO_2$) and nitric acid ($HNO_3$). The halide may comprise at least one element from the group of: chlorine ($Cl_2$), hydrochloric acid (HCl), xenon difluoride ($XeF_2$), hydrofluoric acid (HF), iodine ($I_2$), hydrogen iodide (HI), bromine ($Br_2$), hydrogen bromide (HBr), nitrosyl chloride (NOCl), phosphorus trichloride ($PCl_3$), phosphorus pentachloride ($PCl_5$) and phosphorus trifluoride ($PF_3$). The reducing agent may comprise at least one element from the group of: hydrogen ($H_2$), ammonia ($NH_3$) and methane ($CH_4$).

The particle beam may comprise at least one element from the group of: an electron beam, an ion beam, an atomic beam, a molecule beam and a photon beam.

Further, the control device can be embodied to control the first means. Moreover, the control device can be embodied to control the particle beam and the first means for depositing a protective layer around the processing site.

The apparatus for processing a photolithographic mask may moreover comprise at least one detector, which is embodied to detect the particles originating from the photolithographic mask, which particles are caused by the particle beam. The particles originating from the photolithographic mask might comprise the particle type of the time-varying particle beam. The particles originating from the photolithographic mask might differ from the particle type of the particle beam.

Moreover, the apparatus for processing a photolithographic mask can be embodied to carry out the steps of the methods, defined below, for processing a photolithographic mask.

In one embodiment, the method for processing a photolithographic mask includes the steps of: (a) providing at least one precursor gas; (b) carrying out a local deposition reaction and/or a local etching reaction on the photolithographic mask by having a time-varying particle beam act on the precursor gas; and (c) reducing a mean angle of incidence between the time-varying particle beam and a surface of the photolithographic mask while carrying out at least part of the local deposition reaction and/or the local etching reaction.

The method for processing a photolithographic mask may further include the step of: analyzing the photolithographic mask using the particle beam.

The method for processing a photolithographic mask may further include the step of: changing the angle of incidence while carrying out the local deposition reaction and/or the local etching reaction. As already explained above, the angle of incidence in spherical coordinates comprises the azimuth angle or the polar angle.

The method for processing a photolithographic mask may further include the step of: interrupting the local deposition reaction and/or the local etching reaction and, using the particle beam, analyzing a produced part of a structure to be produced and/or a site to be etched.

The method for processing a photolithographic mask can be interrupted during a local processing process for the photolithographic mask. The particle beam can be used to analyze the processing site. The mean angle of incidence can be modified on the basis of the analysis process, before the processing process is continued. This process guidance allows the edge slope of a side wall of a structure to be produced to be changed during a processing process.

The mean angle of incidence of the particle beam on the surface of the photolithographic mask can be changed in automated form by a control device.

A computer program may comprise instructions that prompt a computer system of an apparatus according to one of the above-described aspects to carry out the method steps of one of the above-described aspects when the computer system executes the computer program.

DESCRIPTION OF DRAWINGS

The following detailed description describes currently preferred exemplary embodiments of the invention, with reference being made to the drawings, in which.

DETAILED DESCRIPTION

Currently preferred embodiments of an apparatus according to the invention and of a method according to the invention for processing a photolithographic mask are explained in more detail below. The apparatus according to the invention is described using the example of a scanning electron microscope. However, the apparatus according to the invention is not restricted to a scanning electron microscope. Rather, an apparatus according to the invention can be based on any scanning particle microscope; i.e., an apparatus as defined in this application can use any type of particle for processing a photomask. Further, an apparatus according to the invention and the use of a method according to the invention are not restricted to processing of photolithographic masks only. Rather, the apparatuses and methods explained here can be used for processing various microstructured components. Examples to this end include templates for nanoimprint lithography, wafers, ICs (integrated circuits), MEMSs (micro-electromechanical systems) and PICs (photonic integrated circuits).

Figure 1:
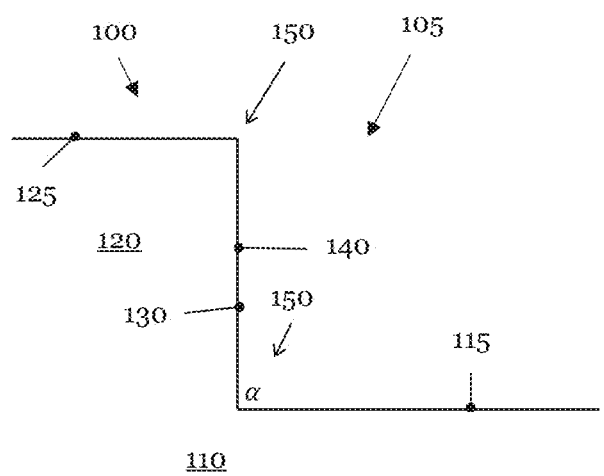
FIG. 1 depicts, in the upper partial image, a schematic section of an edge of a pattern element of a photolithographic mask as predetermined by the design and reproduces, in the lower partial image, an edge of the pattern element of the upper partial image, produced without defects.
Figure 1:
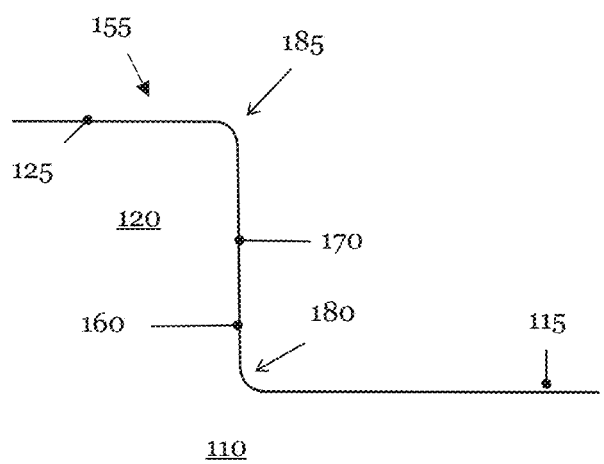

The upper partial image 105 in FIG. 1 schematically shows a section through an excerpt of a photolithographic mask 100. The mask 100 can be a transmitting or a reflecting mask 100. In the example of FIG. 1, the photomask 100 comprises a substrate 110 and a pattern element 120 or a structure element 120. The substrate 110 can comprise a quartz substrate and/or a material with a low coefficient of thermal expansion (LTE (low thermal expansion) substrate). The pattern element 120 can be a structure element 120 of a binary photomask 100. In this case, the pattern element 120 may comprise an element of an absorber structure 120 and may include chromium, for example. However, the pattern element 120 could also comprise a structure element 120 of a phase-shifting photomask 100. By way of example, a phase-shifting mask 100 can be produced by etching an appropriate pattern into the substrate 110 of the mask 100. Further, the pattern element 120 could comprise a structure element 120, which displaces the phase of the actinic radiation relative to the radiation incident on the substrate 110 and also absorbs some of the light at the actinic wavelength that is incident on the pattern element 120. Examples of this include OMOG (opaque MoSi (molybdenum silicide) on glass) masks.

The upper partial image 105 in FIG. 1 shows an ideal edge 130, as predetermined by the design, or a section through a side wall 140. The edge 130 of the pattern element 120 is characterized by the slope angle α of the side wall 140 and by the radii 150 or radii of curvature 150, by use of which the edge 130 merges, firstly, into the surface 115 of the substrate 110 of the mask 100 and, secondly, into the plane surface 125 of the pattern element 120. Typically, the design prescribes a slope angle α of substantially 90° for the side wall 140. The radii of curvature 150 of the edges 130 or of the side walls 140 of the pattern elements 120 should be as small as possible, i.e., lie as close to zero as possible.

The lower partial image 155 in FIG. 1 presents a section through a pattern element 120 produced as per the design prescriptions discussed above on the substrate 110 of the photomask 100. The slope angle α of the side wall 170 or of the edge 160 is substantially 90° and consequently exhibits good correspondence with the prescription of the design. The radii of curvature 180 and 185 of the edge 160 are not zero but are so small that the pattern element 120 carries out its function. This means that a photolithographic mask 100 whose structure elements 120 have edges 160 or slope angles α of the side walls 170 as depicted in the lower partial image 155 of FIG. 1 meets the specification.

Figure 2:
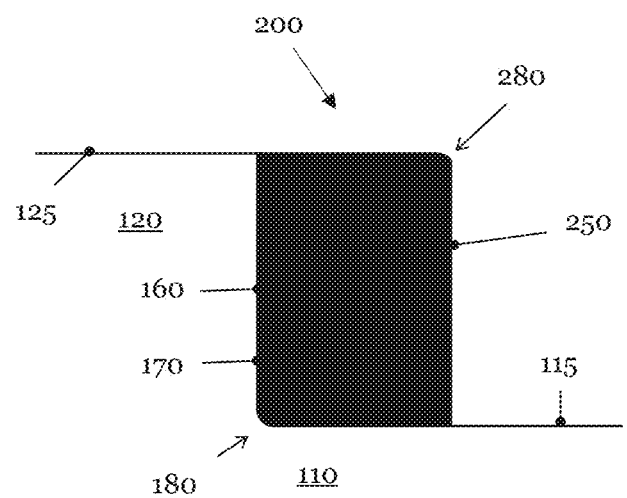
FIG. 2 shows a schematic section of an edge of a pattern element of a photolithographic mask that has a defect in the form of excess material.

FIG. 2 shows a schematic section through a photolithographic mask 200 comprising a substrate 110 and a pattern element 120, which has excess material 250 at the edge 160 or the side wall 170. The excess material 250 may comprise material of the pattern element 120 or material of the substrate 110. However, the defect of excess material 250 may also be a particle that has settled at the edge 160 of the pattern element 120. Excess material 250 in the form of a particle typically has a material composition that differs from that of the photomask 200.

In the example reproduced in FIG. 2, the defect of excess material 250 has the same height as the pattern element 120. However, this is no precondition for the use of an apparatus as described in this application for processing the defect of excess material 250. Rather, the explained apparatuses can process the defects of excess material 250 that have virtually any form.

Figure 3:
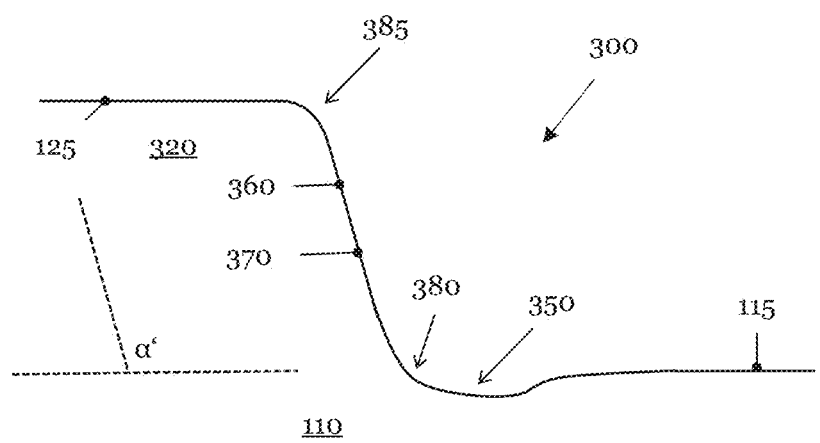
FIG. 3 presents a schematic section of the edge of the pattern element from FIG. 2 after carrying out a local repair process, as per the prior art, for removing the defect.

FIG. 3 presents the section through the excerpt of the mask 200 from FIG. 2 after the excess material 250 or the defect of excess material 250 has been removed with the aid of a local particle beam-induced etching process, for instance an EBIE (electron beam induced etching) process according to the prior art. What can be gathered from the repaired photomask 300 presented in FIG. 3 is that the slope angle α' of the side wall 370 that has arisen as a result of the local etching process deviates significantly from the angle α=90° demanded by the design. Further, the radii of curvature 380, 385 of the edge 360 of the produced pattern element 320 have been greatly increased in relation to the example specified in the lower partial image 155 of FIG. 1. Moreover, a part 350 of the substrate 110 of the mask 200 in and around the region previously covered by the excess material 250 has been removed by the local etching process. As a consequence of the explained disadvantageous effects of the local etching process, the repaired mask 300 still does not meet the predetermined imaging specification.

FIG. 3 was used above to explain the difficulties when processing a defect of excess material 250 by carrying out a particle beam-induced local etching process. A second class of frequently occurring defects of photolithographic masks are defects of missing material, for instance missing absorber material in the case of binary masks (not depicted in FIG. 3). Like in the case of local etching, slope angles of the side walls of the deposited pattern elements that deviate significantly from 90° are produced within the scope of the local deposition of missing material, for instance missing absorber material, with the aid of a particle beam-induced deposition process, for instance an EBID (electron beam induced deposition) process. Moreover, the radii of curvature of the deposited pattern elements are frequently also significantly larger than the radii of curvature 180, 185 of pattern elements 120 deposited in the original production process of the defect-free mask 150. Moreover, on account of the local deposition process, there is an unwanted material accumulation on parts of the surface 115 of the substrate 110 that should be free from deposited material.

This means that the local deposition process produces a type of halo around the local processing site. The material additionally deposited on parts of the surface 115 of the substrate 110 and the above-described deficiencies of a local EBID process usually have as a consequence a local impairment of the functionality of a repaired photolithographic mask.

At least some of the causes leading to the problems discussed above in the context of FIG. 3 are explained below on the basis of FIGS. 4 and 5.

Figure 4:
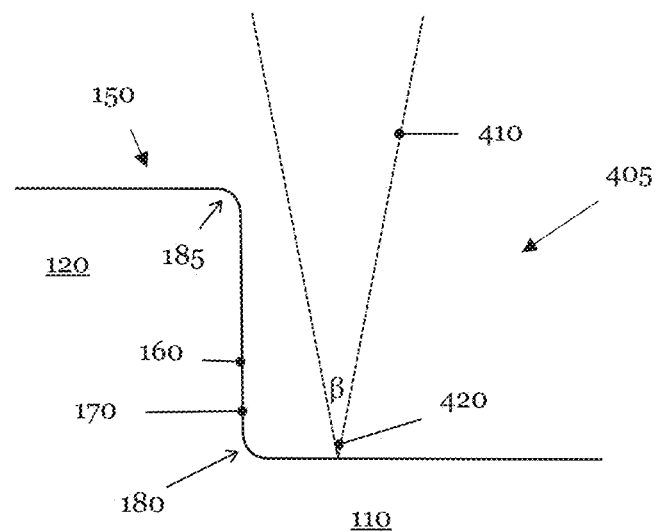
FIG. 4 reproduces FIG. 2 in the upper partial image, wherein a particle beam with an aperture angle β is incident on the photolithographic mask, and illustrates the intensity distribution in the focus of the particle beam of the upper partial image in the lower partial image.
Figure 4:
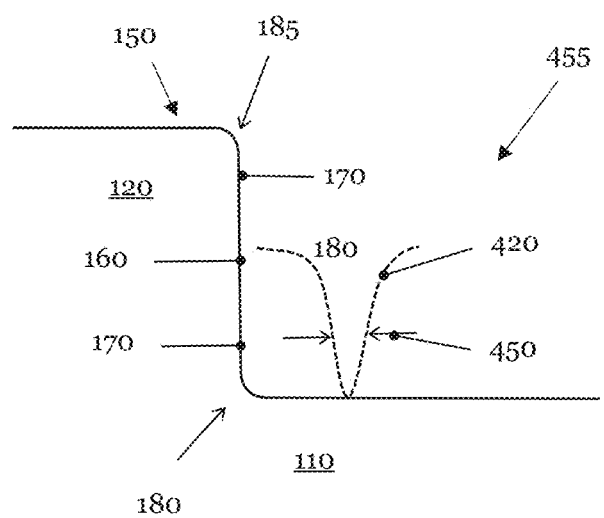

The upper partial image 405 of FIG. 4 reproduces the excerpt of the photolithographic mask 150 from FIG. 2. A particle beam 410 having an aperture angle β strikes the substrate 110 of the mask 150. The aperture angle β may comprise an angle range from approximately 0.1 mrad to 100 mrad. The particle beam 410 strikes the surface 115 of the substrate 110 of the mask 150 in substantially perpendicular fashion. The lower partial image 455 of FIG. 4 shows the intensity distribution of the particle beam 410 within its tip 420 or its focus 420 or at the point of incidence of the particle beam 410 on the surface 115 of the substrate 110 of the mask 150 from FIG. 2. Typically, the particle beam 410 has a Gaussian or Gaussian-like intensity profile at its focus 420. The minimum achievable full width at half maximum (FWHM) 450 depends on the particle type of the particle beam 410. Currently, it is possible for electron beams to be focused onto spot diameters in the focus in the sub-nanometer range.

So as to obtain a spatial resolution for a local processing process that is as high as possible, the particle beam 410 must be focused onto a small spot 450 at the processing location. Like in the field of optics, the requirement of a small spot diameter at the focus however necessitates a large aperture angle β for the particle beam 410. As visualized in the upper partial image 405 of FIG. 4, a large aperture angle β of the particle beam 410 however impairs the ability of the particle beam 410 to access processing or repair locations that are located in the vicinity of edges 160 or steep side walls 170 of pattern elements 120.

FIG. 5 again reproduces FIG. 2, in which the particle beam 410 from FIG. 4 additionally incidents on the material of the photolithographic mask 150. In FIG. 5, reference sign 510 denotes the interaction region that the particle beam 410 generates when incident on the substrate 110 of the photolithographic mask 150. When the particle beam 410 is incident on the substrate 110, the particles of said particle beam, for example electrons, are scattered in the electromagnetic field of the atomic nuclei of the substrate material 110. The energy of the incident particles of the particle beam 410 produces secondary products in the interaction volume 510 or in the scattering cone 510. By way of example, the scattering processes of the incident particles with the atomic nuclei transfer energy to the lattice of the substrate material 110 of the mask 150, as a result of which the substrate material 110 is heated locally. The electrons of the substrate material 110 may also, by way of scattering processes, absorb energy from the primary particles of the particle beam 410 incident on the substrate 110 at the point 520 and may be released as secondary electrons and/or as backscattered electrons. The size and the shape of the interaction region 510 depends on the particle type of the particle beam 410 and on the kinetic energy of the particles of the particle beam 410 incident on the substrate 110. Further, the material or the material composition of the substrate 110 influences the size and the form of the scattering cone 510.

During a processing process, molecules of a precursor gas are adsorbed at the surface 115 of the substrate 110 in the vicinity of a site to be processed. Molecules of a precursor gas that are present in the region of the point of incidence 520 of the particle beam 410 on the surface 125 of the substrate 110 of the mask 150, 200 are decomposed into their constituent parts by the processes running in the interaction region 510—for instance, by the absorption of secondary electrons and/or backscattered electrons—or said molecules trigger a local chemical reaction between the adsorbed precursor gas molecules and the molecules or atoms of the substrate material of the mask 150, 200.

When the particle beam 410 is incident on the substrate 110, the interaction region 510 or the scattering cone 510 is located substantially within the substrate 110 of the mask 150. Should the particle beam 410 be incident on the edge 160 or the side wall 170 of the pattern element 120 of the mask 150, only some of the processes running in the interaction region 510 occur within the material of the pattern element 120 of the mask 150. This is visualized in FIG. 5 by the deformed or substantially halved interaction region 550. A portion of the secondary or backscattered particles 560 that are produced in the deformed interaction region 550 can leave the interaction region 550 and reach the surface 115 of the substrate 110 of the mask 100. This is illustrated by the arrows 560 in FIG. 5. Unlike in the material of the pattern element 120, there are hardly any interaction processes in the vacuum environment in which the mask 150, 200 is typically located during a processing process.

As already explained above, the surface 125 of the substrate 110 of the mask 200 during a processing process of the photolithographic mask 200 is covered by molecules of the precursor gas in the region of the edge 160 or the side wall 170 of the pattern element 120. The secondary particles 560 that are released by the particle beam 410 in the deformed interaction region 550 and incident on the surface 115 of the substrate 110 initiate unwanted local processing processes on the substrate 110. Should the precursor gas be present in the form of an etching gas, this is an etching process of the substrate 110 that leads to a local depression 350 in the substrate 110, as indicated in FIG. 3. By contrast, precursor gases present in the form of deposition gases often lead to unwanted local deposition processes on the substrate 110 of the photolithographic mask 200.

Figure 5:
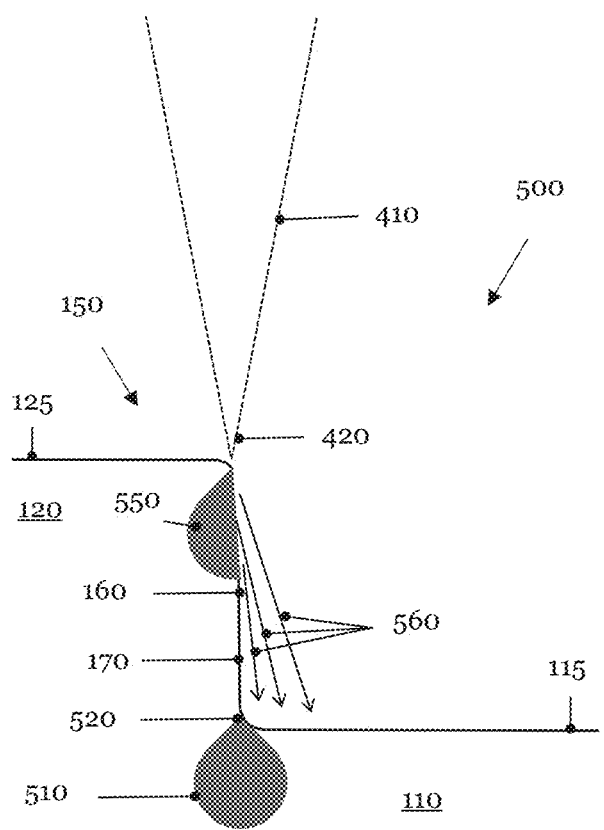
FIG. 5 depicts an interaction region ("scattering cone") of the particle beam from FIG. 4 when processing an edge or a side wall of the pattern element of the photolithographic mask from FIG. 2 according to the prior art.
Figure 6:
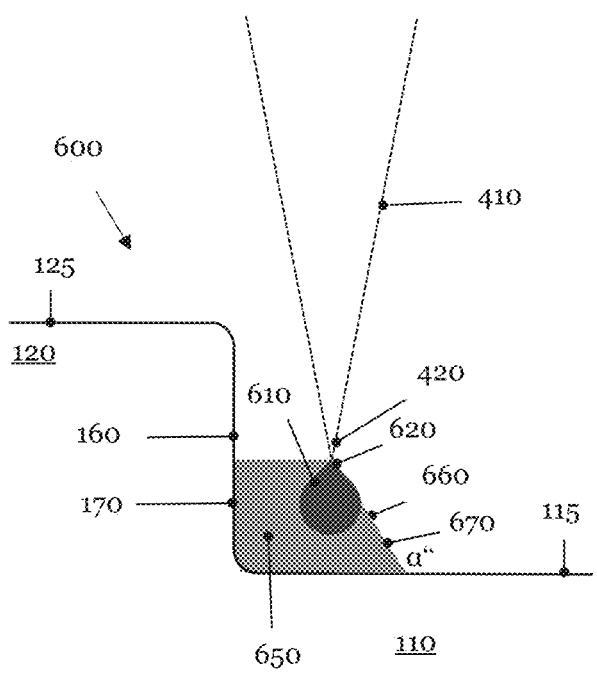
FIG. 6 schematically visualizes a particle beam-induced deposition process according to the prior art being carried out.

Diagram 600 of FIG. 6 visualizes the correction of a defect of missing material by way of the deposition of material 650 along the side wall 170 of the pattern element 120 on the substrate 110 of the photolithographic mask 150. FIG. 6 illustrates an EIBD process as per the prior art being carried out. It was explained within the context of FIG. 5 that the electron beam 410 generates an interaction region 510 in the substrate upon incidence on the surface 115 of the substrate 110 of the mask 150. The processes running in the interaction region 510 facilitate the splitting of the molecules of a precursor gas which are adsorbed at the surface 115 of the substrate 110. Should the molecules of the precursor gas adsorbed on the surface 115 of the substrate 110 be a deposition gas, a constituent part or a component of the molecules of the deposition gas split by the action of the electron beam 410 can be deposited on the surface 115 of the substrate. Thus, for example, a metal carbonyl is split into a metal atom or metal ion and carbon monoxide by the direct and/or indirect action of the electron beam 410. The metal atom may settle on the surface 115 of the substrate 110 while the volatile carbon monoxide molecules can predominantly leave the processing location.

By way of sequentially scanning the focused electron beam 410 over the region of missing material 650, the missing material is deposited layer-by-layer on the substrate 110 in the presence of the deposition gas. However, the size of the interaction region 610 generated by the electron beam 410 in the substrate or in the deposit 650 or deposited material 650 prevents side walls 670 or edges with slope angles of substantially 90° from being able to be deposited. Instead, the size of the interaction region 610 at least partly sets the size of the slope angle $\alpha''$ of the side wall 670 or of the edge 660 of the deposit 650. Like when a local etching process is carried out, the size and the shape of the interaction region 610 depends on the kinetic energy of the electrons of the electron beam 410 and on the material composition of the deposit 650.

Figure 7:
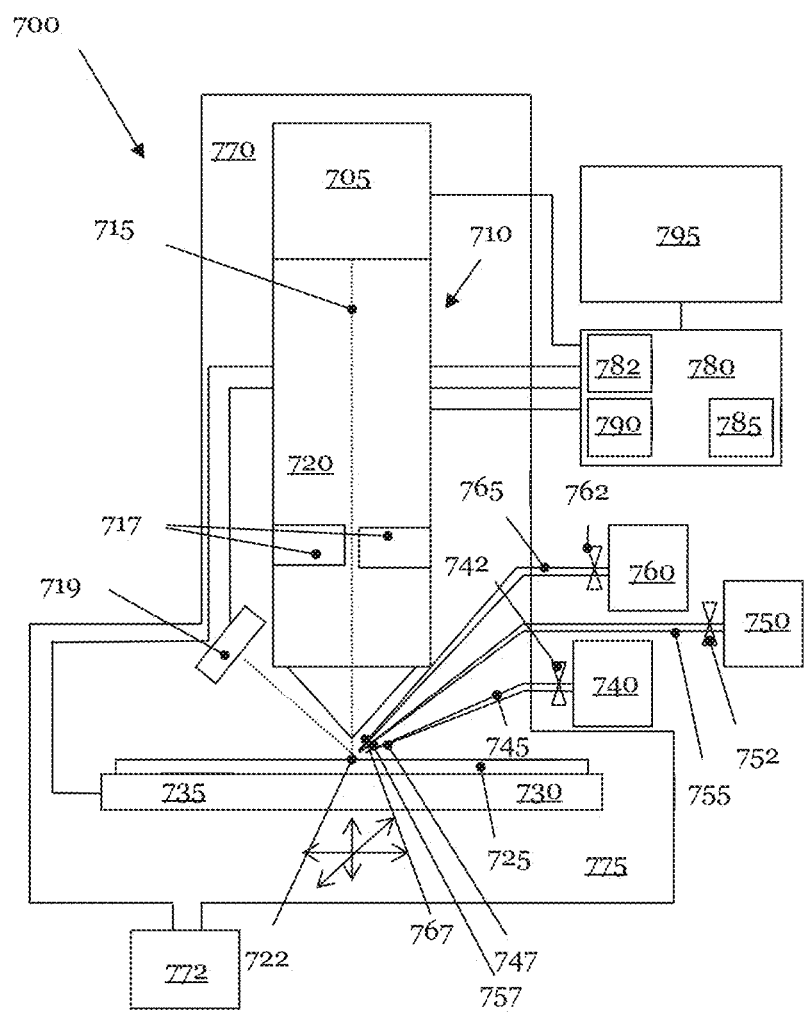
FIG. 7 shows a schematic section through a few components of an apparatus for processing a photolithographic mask.

FIG. 7 shows a schematic section through some important components of an apparatus 700 that is able to prevent the occurrence of at least one of the above-described difficulties when locally processing a specimen 725, for example of a photolithographic mask 200. The exemplary apparatus 700 of FIG. 7 comprises a modified scanning particle microscope 710 in the form of a scanning electron microscope (SEM) 710.

An electron beam 715 as a particle beam 715 is advantageous in that it substantially cannot damage the specimen or the photolithographic mask 200. However, it is also possible to use an ion beam, an atom beam or a molecule beam (not illustrated in FIG. 6) in the apparatus 700 for the purposes of processing the specimen 725.

The scanning particle microscope 710 is composed of an electron gun 705 and a column 715, in which the beam optical unit 720, for instance in the form of an electron optical unit of the SEM 710, is disposed. In the SEM 710 of FIG. 7, an electron gun 705 produces an electron beam 715, which is directed as a focused electron beam 715 onto the site 722 on the specimen 725 that may comprise the photolithographic mask 200 by the imaging elements, not illustrated in FIG. 7, disposed in the column 720. The specimen 725 is disposed on a specimen stage 730 (or stage). Further, the imaging elements of the column 720 of the SEM 710 can scan the electron beam 715 over the specimen 725. The specimen 725 can be examined using the electron beam 715 of the SEM 710. Further, the electron beam 715 can be used to induce a particle beam-induced deposition process (EBID, electron beam induced deposition) and/or a particle beam-induced etching process (EBIE, electron beam induced etching). Moreover, the electron beam 715 of the SEM 710 can be used to analyze the specimen 725 or a defect of the specimen 725, for example the defect of excess material 250 on the photolithographic mask 200.

The backscattered electrons and secondary electrons generated in the interaction region 510, 550, 610 of the specimen 725 by the electron beam 715 are registered by the detector 717. The detector 717 that is disposed in the electron column 720 is referred to as an "in lens detector." The detector 717 can be installed in the column 720 in various embodiments. The detector 717 converts the secondary electrons generated by the electron beam 715 at the measurement point 722 and/or the electrons backscattered from the specimen 725 into an electrical measurement signal and transmits the latter to an evaluation unit 785 of a computer system 780 of the apparatus 700. The detector 717 may contain a filter or a filter system in order to discriminate the electrons in terms of energy and/or solid angle (not reproduced in FIG. 7). The detector 717 is controlled by a control device 790 of the apparatus 700.

The apparatus 700 may contain a second detector 719. The second detector 719 is designed to detect electromagnetic radiation, particularly in the x-ray region. As a result, the detector 719 facilitates the analysis of the radiation generated during a process of processing the specimen 725. The detector 719 is likewise controlled by the control device 790.

Further, the apparatus 700 may comprise a third detector (not illustrated in FIG. 7). The third detector is often embodied in the form of an Everhart-Thornley detector and typically disposed outside of the column 720. As a rule, it is used to detect secondary electrons.

The apparatus 700 may comprise an ion source that provides ions with low kinetic energy in the region of the specimen 725 (not illustrated in FIG. 7). The ions with low kinetic energy can compensate charging of the specimen 725. Further, the apparatus 700 may have a mesh on the output of the column 720 of the modified SEM 710 (not shown in FIG. 7). Electrostatic charging of a specimen 725 can likewise be compensated by applying a voltage to the mesh. It is furthermore possible to earth the mesh.

The specimen 725 is disposed on a specimen stage 730 or a specimen holder 730. A specimen stage 730 is also known as a "stage" in the art. As indicated by the arrows in FIG. 7, the specimen stage 730 can be moved in three spatial directions relative to the column 715 of the SEM 710, for example by way of micro-manipulators that are not illustrated in FIG. 7.

Figure 8:
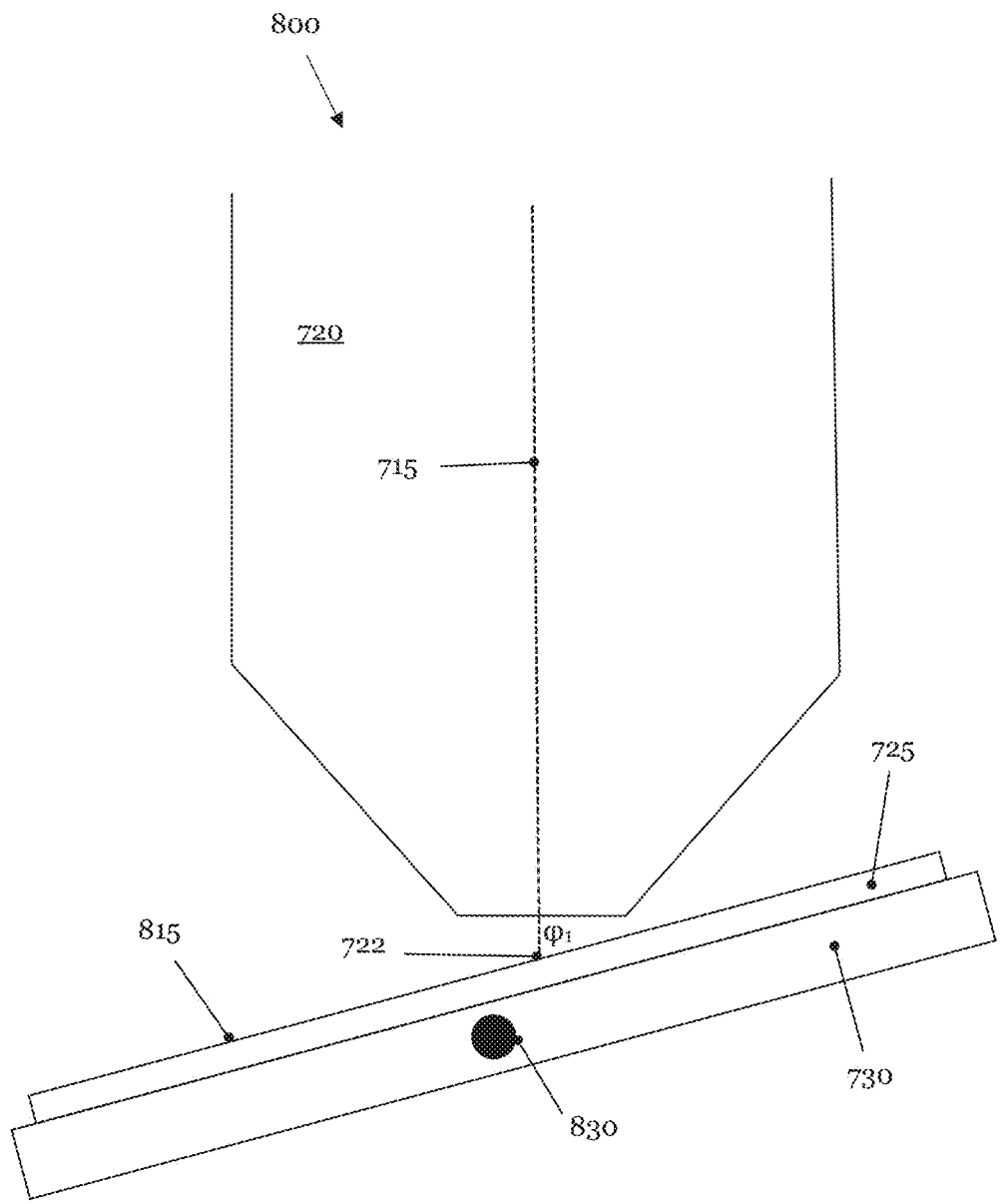
FIG. 8 reproduces a magnified excerpt of the apparatus from FIG. 7 with a tilt apparatus for tilting the photolithographic mask relative to the particle beam of the apparatus from FIG. 7.

In addition to the translational movement, the specimen stage 730 can be rotated about three axes that are perpendicular to one another. Diagram 800 of FIG. 8 schematically shows a rotation of the specimen stage 730 about an axis perpendicular to the plane of the paper. The specimen stage 730 can contain one or more motors and/or actuators (not indicated in FIGS. 7 and 8) for rotating the sample 725 arranged on the specimen stage 730. A rotary encoder may be used to determine the amount of rotation. Alternatively, and/or additionally, one or several interferometers can be used to measure the amount of rotation. The interferometer may be a laser interferometer.

As a result of these rotation options, the specimen stage 730 realizes a tilt apparatus 830. Rotating the specimen stage 730 allows the angle of incidence $\varphi_1$ of the electron beam 715 on a surface 815 of the specimen 725 to be reduced in comparison with the substantially perpendicular incidence of the electrons of the electron beam 410 on the specimen 725 from FIG. 7. The tilt apparatus 830 can tilt the specimen stage 730 by up to 45° from the horizontal. Further, the tilt apparatus 830 can be rotated through 360° about an axis of rotation that is perpendicular to the plane of the specimen stage. In principle, a tilt apparatus 830 can be embodied in at least three variants. In a first embodiment, which is schematically depicted in FIG. 8, the tilt axis is stationary and perpendicular to the plane of the paper. The axis of rotation is in the plane of the paper and perpendicular to the axis of rotation. In a second embodiment, the tilt unit or tilt apparatus sits on the rotation unit or rotation apparatus. The axis of rotation is stationary in this exemplary embodiment. By way of example, said axis of rotation is parallel to the z-direction, i.e., parallel to the electron beam 715. In a third embodiment, the specimen 725, e.g., the mask 150, 200, is tilted. By way of example, this can be implemented by two height-adjustable supports. The exemplary embodiment specified last is restricted to small tilt angles.

The angle of incidence $\varphi_1$ on the surface 815 of the specimen 725 can be reduced in controlled fashion at each point on the specimen 725 by way of a rotation of the specimen stage 730 about two mutually perpendicular axes of rotation and the additional option of rotating the specimen 725 about the axis of the electron beam 715. The control device 790 of the apparatus 700 can control both the translational and the rotational movements of the specimen stage 730.

Returning to FIG. 7, the specimen 725 can be any microstructured component or component part requiring processing, for example the repair of a local defect 250. Thus, the specimen 725 may comprise, for example, a transmissive or a reflective photomask 200 and/or a template for nanoimprint technology. The transmissive and the reflective photomask 150, 200 can comprise all types of photomasks, for instance binary masks, phase-shifting masks, OMOG masks, or masks for a dual or multiple exposure.

Further, the apparatus 700 of FIG. 7 may comprise one or more scanning probe microscopes, for example in the form of an atomic force microscope (AFM) (not shown in FIG. 7), which can be used to analyze and/or process the specimen 725.

The column 720 of the scanning electron microscope 710 can be pivoted or rotated about at least one axis. Diagram 900 illustrates the specimen-side end of the column 720 in a pivoted state with respect to a horizontally disposed specimen stage 730. The column 720 of the scanning electron microscope 710 can comprise one or more motors and/or actuators (not indicated in FIGS. 7 and 9) for rotating the column 720. It is also possible to use a hydraulic unit (also not shown in FIG. 7 or 9) for pivoting the column 720 as the column 720 has some weight. After performing a calibration process, the shift of the electron beam on a sample can be used to detect the rotation of the column 720. Alternatively, or additionally, a rotary encoder may be used to determine the amount of pivoting. Furthermore, one or several interferometers can be used to measure the amount of rotation. The interferometer may be a laser interferometer.

Figure 9:
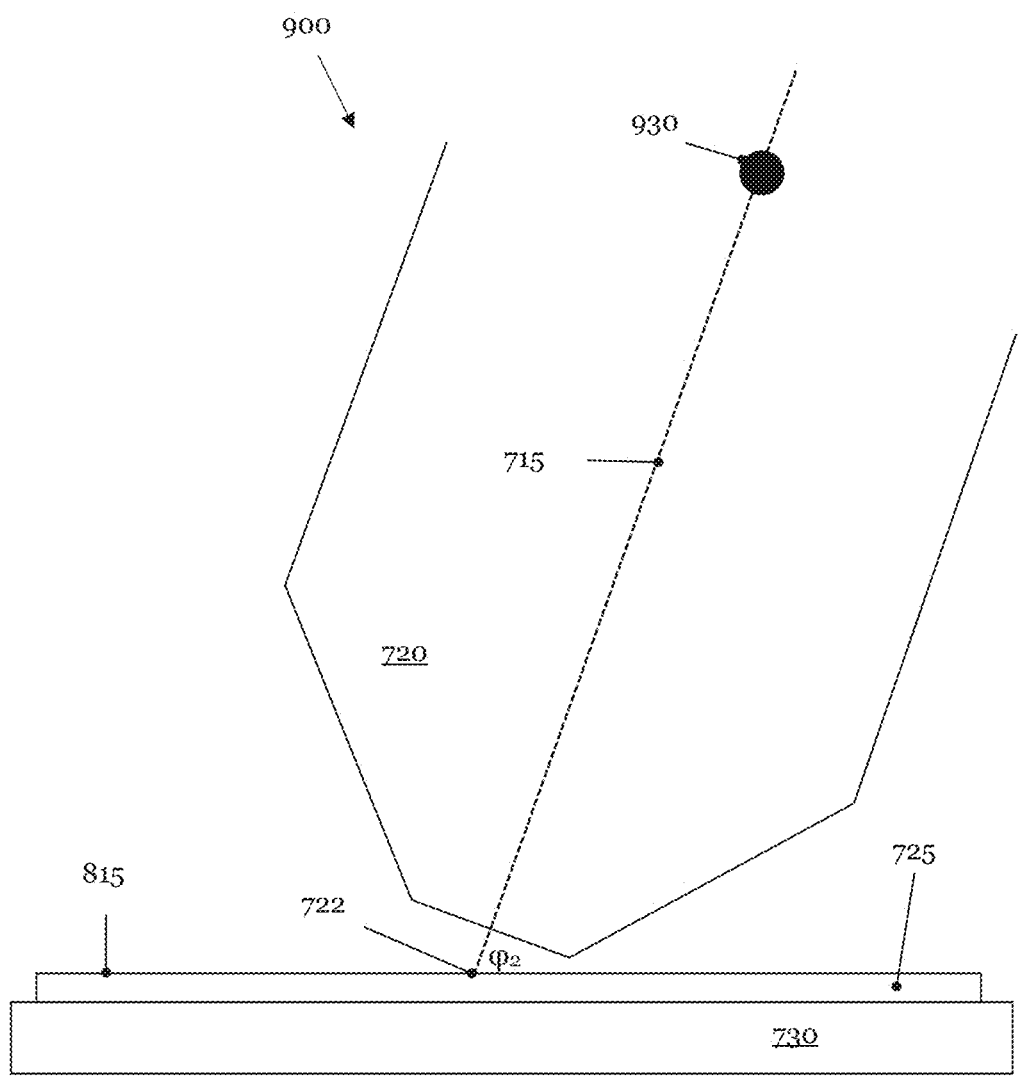
FIG. 9 depicts a magnified excerpt of the apparatus from FIG. 7 with a pivot apparatus for tilting the particle beam of the apparatus from FIG. 7 relative to the photolithographic mask.

In FIG. 9, the pivot apparatus 930 is indicated by a rotation or pivot axis 930 that is perpendicular to the plane of the paper. The pivot apparatus 930 can pivot the column 720 of the SEM 710 in at least one direction. However, it is also possible to embody the pivot apparatus 930 to allow the column 720 to preferably be deflected along two mutually perpendicular pivot axes. As the column 720 of a scanning electron microscope 710 is large and heavy, it is currently preferred for the pivot apparatus 930 to be embodied to be rotatable about one pivot axis only and for the specimen stage 730 to be embodied to be rotatable about an axis of rotation that is perpendicular to the specimen stage plane. In a further exemplary embodiment, it is possible to install the column 720 in the apparatus 700 at a fixed angle, which deviates from 90°, in relation to the surface of the specimen stage 730.

The apparatus 700 could have both a tilt apparatus 830 for the specimen stage 730 and a pivot apparatus 930 for the column 720 of the SEM 710.

Returning to FIG. 7, the electron beam 715 of the modified SEM 710 can also be used to induce an electron beam-induced deposition process and an EBIE process in addition to the analysis of the specimen 725, as already explained above. Further, the electron beam 715 of the SEM 710 of the apparatus 700 can also be used to carry out an EBID process. The apparatus 700 of FIG. 7 has three different supply containers 740, 750 and 760, for storing various precursor gases, for the purposes of carrying out these processes.

The first supply container 740 stores a precursor gas, for example a metal carbonyl, for instance chromium hexacarbonyl ($Cr(CO)_6$), or a main group metal alkoxide, such as TEOS, for instance. With the aid of the precursor gas stored in the first supply container 740, material missing from the photolithographic mask 200 can be deposited thereon within the scope of a local chemical deposition reaction, for example. Missing material of a mask 200 may comprise missing absorber material, for example chromium, missing substrate material 110, for instance quartz, missing material of an OMOG mask, for instance molybdenum silicide, or missing material of a multi-layer structure of a reflecting photomask.

As described above in the context of FIG. 5, the electron beam 715 of the SEM 710 acts as an energy supplier for splitting the precursor gas, which is stored in the first supply container 740, at the site where material should be deposited on the specimen 725. This means that the combined provision of an electron beam 715 and a precursor gas leads to an EBID (electron beam induced deposition) process being carried out for local deposition of missing material, for example material missing from the photomask 200. The modified SEM 710 of the apparatus 700 forms a deposition apparatus in combination with the first supply container 740.

An electron beam 715 can be focused onto a spot diameter of a few nanometers. As a result, an EBID process allows the local deposition of missing material with a spatial resolution typically ranging from 5 nm to 20 nm. However, a small focus diameter of the electron beam 715 correlates with a large aperture angle β—as discussed in the context of FIG. 4.

In the apparatus 700 depicted in FIG. 7, the second supply container 750 stores an etching gas, which allows a local electron beam-induced etching (EBIE) process to be carried out. Excess material can be removed from the specimen 725, for instance the excess material 250 or the defect of excess material 250 from the surface 115 of the substrate 110 of the photolithographic mask 200, with the aid of an electron beam-induced etching process. By way of example, an etching gas may comprise xenon difluoride ($XeF_2$), a halogen or nitrosyl chloride (NOCl). Consequently, the modified SEM 710 forms a local etching apparatus in combination with the second supply container 750.

An additive or additional gas can be stored in the third supply container 760, said additive gas, where necessary, being able to be added to the etching gas kept available in the second supply container 750 or to the precursor gas stored in the first supply container 740. Alternatively, the third supply container 760 can store a second precursor gas or a second etching gas.

In the scanning electron microscope 710 illustrated in FIG. 7, each of the supply containers 740, 750 and 760 has its own control valve 742, 752 and 762 in order to monitor or control the amount of the corresponding gas that is provided per unit time, i.e., the gas volumetric flow at the location 722 of the incidence of the electron beam 715 on the specimen 725. The control valves 742, 752 and 762 are controlled and monitored by the control device 790. Using this, it is possible to set the partial pressure conditions of the gas or gases provided at the processing location 722 for carrying out an EBID and/or EBIE process in a wide range.

Furthermore, in the exemplary SEM 710 in FIG. 7, each supply container 740, 750 and 760 has its own gas feedline system 745, 755 and 765, which ends with a nozzle 747, 757 and 767 in the vicinity of the point of incidence 722 of the electron beam 715 on the specimen 725.

The supply containers 740, 750 and 760 can have their own temperature setting element and/or control element, which allows both cooling and heating of the corresponding supply containers 740, 750 and 760. This makes it possible to store and in particular provide the precursor gas and/or the etching gas(es) at the respectively optimum temperature (not shown in FIG. 7). The control device 790 can control the temperature setting elements and the temperature control elements of the supply containers 740, 750, 760. During the EBID and the EBIE processing processes, the temperature setting elements of the supply containers 740, 750 and 760 can further be used to set the vapor pressure of the precursor gases stored therein by way of the selection of an appropriate temperature.

The apparatus 700 may comprise more than one supply container 740 in order to store two or more precursor gases. Further, the apparatus 700 may comprise more than one supply container 750 in order to store two or more etching gases (not shown in FIG. 7).

The scanning electron microscope 710 illustrated in FIG. 7 is operated in a vacuum chamber 770. Implementing the EBID and EBIE processes necessitates a negative pressure in the vacuum chamber 770 relative to the ambient pressure. For this purpose, the SEM 710 in FIG. 7 comprises a pump system 772 for generating and for maintaining a negative pressure required in the vacuum chamber 770. With closed control valves 742, 752 and 762, a residual gas pressure of $<10^{-4}$ Pa is achieved in the vacuum chamber 770. The pump system 772 can comprise separate pump systems for the upper part of the vacuum chamber 770 for providing the electron beam 715 of the SEM 710, and for the lower part 775 or the reaction chamber 775 (not shown in FIG. 7).

The apparatus 700 contains a computer system 780. The computer system 780 comprises a scanning unit 782, which scans the electron beam 715 over the specimen 725. Further, the computer system 780 comprises a control unit 790 for setting and controlling the various parameters of the modified scanning particle microscope 710 of the apparatus 700. Moreover, the control unit 790 can control the tilt apparatus 830 of the specimen stage 730 and the pivot apparatus 930 of the column 720 of the SEM 710.

Moreover, the computer system 780 comprises an evaluation unit 785, which analyzes the measurement signals from the detectors 717 and 719 and produces an image therefrom, said image being displayed on the display 795 of the computer system 780. In particular, the evaluation unit 785 is designed to determine the position and a contour of a defect of missing material and/or a defect of excess material 250 of a specimen 725, for instance of a photolithographic mask 200, from the measurement data of the detector 717. Further, the evaluation unit 785 can obtain scan data from the scanning unit 782 and determine a change of the angle φ (the mean angle of incidence of the particle beam 410, 715) from the scan data. Moreover, the evaluation unit 785 contains one or more algorithms that allow the determination of a repair shape corresponding to the analyzed defects 250 of the mask 200. Moreover, the evaluation unit 785 of the computer system 780 may contain one or more algorithms. The algorithm or algorithms can determine a change in angle of the tilt apparatus 830 of the specimen stage 730 and/or a change in angle of the pivot apparatus 930 of the column 720 of the SEM 710 from the kinetic energy of the electrons of the particle beam 715 and/or from a material composition to be etched or to be deposited. Moreover, algorithms of the evaluation unit 785 can ascertain the parameters of a deflection apparatus. Examples of deflection apparatuses for the electron beam 715 are explained below on the basis of FIGS. 10 and 11. The algorithms of the evaluation unit 785 can be implemented in hardware, software or a combination thereof.

The evaluation unit 785 can further be designed to ascertain, from the measurement data of the detector 719, an area and a positioning of a temporary protective layer relative to a site to be processed. The application of a temporary protective layer at least partly around a local processing site can largely prevent regions of the specimen 725 that are not involved with a local processing process that is being carried out, for instance parts of the substrate 110 of a mask 200, from being impaired or damaged. The control unit 790 of the computer system 780 controls both the deposition of a temporary protective layer and also the removal thereof, for example by carrying out an EBIE process. In an alternative embodiment, the temporary protective layer is removed from the specimen 725 during a cleaning process of the specimen 725, for instance a wet-chemical cleaning process.

The computer system 780 and/or the evaluation unit 785 can contain a memory (not illustrated in FIG. 7), preferably a non-volatile memory, which stores one or more models of repair shapes for various mask types. The evaluation unit 785 can be designed to calculate, on the basis of a repair model, a repair shape for the defects 250 of the photolithographic mask 200 from the measurement data of the detector 717.

As specified in FIG. 7, the evaluation unit 785 can be integrated into the computer system 780. However, it is also possible to embody the evaluation unit 785 as an independent unit within, or outside of, the apparatus 700. In particular, the evaluation unit 785 can be designed to carry out some of its tasks by use of a dedicated hardware implementation.

The computer system 780 can be integrated into the apparatus 700 or embodied as an independent appliance (not shown in FIG. 7). The computer system 780 may be configured in hardware, software, firmware or a combination.

Figure 10:
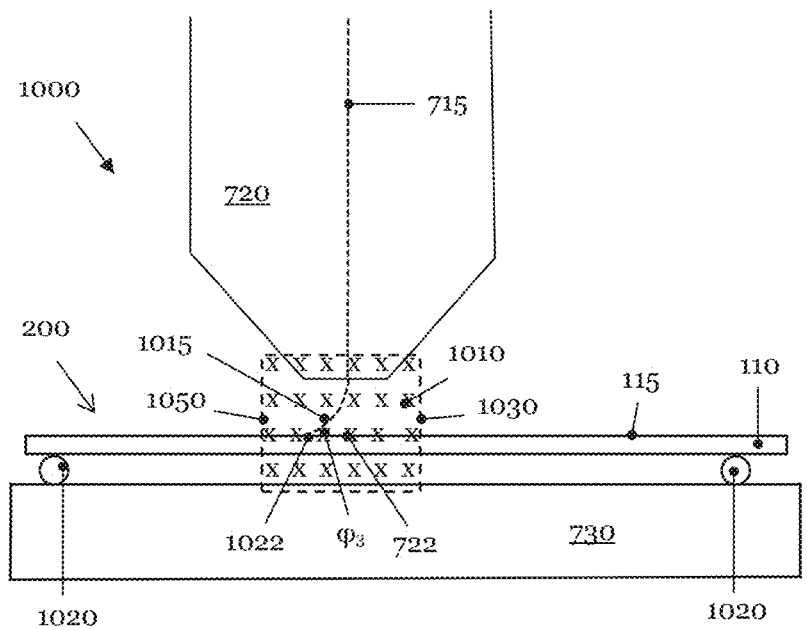
FIG. 10 presents a magnified excerpt of the apparatus from FIG. 7 with a deflection apparatus in the form of a magnetic deflection system at the output of a column of a scanning electron microscope.

Diagram 1000 of FIG. 10 shows a magnified excerpt of the apparatus 700 in the region of the point of incidence 1022 of the electron beam 715 on the photolithographic mask 200 from FIG. 2. In the example illustrated in FIG. 10, the substrate 110 of the photolithographic mask 200 is disposed on the specimen stage 1050 by use of a three-point bearing. The photomask 200 is held in its position by the action of gravity. The section of the diagram 1000 shows two of the three spheres 1020 of the three-point bearing.

A deflection apparatus 1050 is installed in the apparatus 700, between the output of the column 720 of the SEM 710 and the photomask 200. The deflection apparatus 1050 comprises a magnetic deflection system 1030, which may be embodied in the form of a coil pair or one or more permanent magnets (not shown in FIG. 10), for example. In the example depicted in FIG. 10, the magnetic deflection system 1030 generates a magnetic field 1010, the field lines of which are perpendicular to the plane of the paper and directed into the plane of the paper. The electrons of the electron beam 715 are deflected by the magnetic field 1010 generated by the magnetic deflection system 1030 when leaving the column 720 and said electrons strike the photolithographic mask 200 at the point of incidence 1022 after traversing a curved path 1015. By way of example, the electrons of the electron beam 715 reach the defect of excess material 250. The point of incidence 1022 of the electron beam 715 on the mask 200 differs from the point of incidence 722 of the apparatus 700 from FIG. 7. Moreover, the electron beam 715 deflected by the magnetic field 1010 of the magnetic deflection system 1030 strikes the mask 200 at an angle $\varphi_3$ that is smaller than the angle of incidence of the electron beam 715 from FIG. 7. The path 1015 of the electrons, which has been lengthened by the magnetic deflection system 1030, is taken into account when focusing the electron beam 715.

The magnetic deflection system 1030 can generate a homogeneous or inhomogeneous magnetic field 1010. The strength of the magnetic field 1010 can be set by the control unit 785 of the computer system 780.

In the example reproduced in FIG. 10, the magnetic deflection system 1030 generates a homogeneous magnetic field 1010, the field lines of which pass in perpendicular fashion through the plane of the paper. However, the magnetic deflection system 1030 could also generate a second magnetic field, the field lines of which extend parallel to the plane of the paper, for example. With the aid of two magnetic fields that are substantially perpendicular to one another, the magnetic deflection system 1030 can set not only the polar angle of the electron beam 715 but also the azimuth angle thereof by virtue of modifying the field strength of the two magnetic fields. This allows the electron beam 715 to reach different sides of a pattern element 120 of a photolithographic mask 200 at the angle of incidence $\varphi_3$.

In FIG. 10, the magnetic deflection system 1030 is installed into the apparatus 700 as a unit 1050 that is separate from, or independent of, the column 720 of the SEM 710. However, the magnetic deflection system 1030 could also be integrated into the SEM 710 at the output of the column 720.

Figure 11:
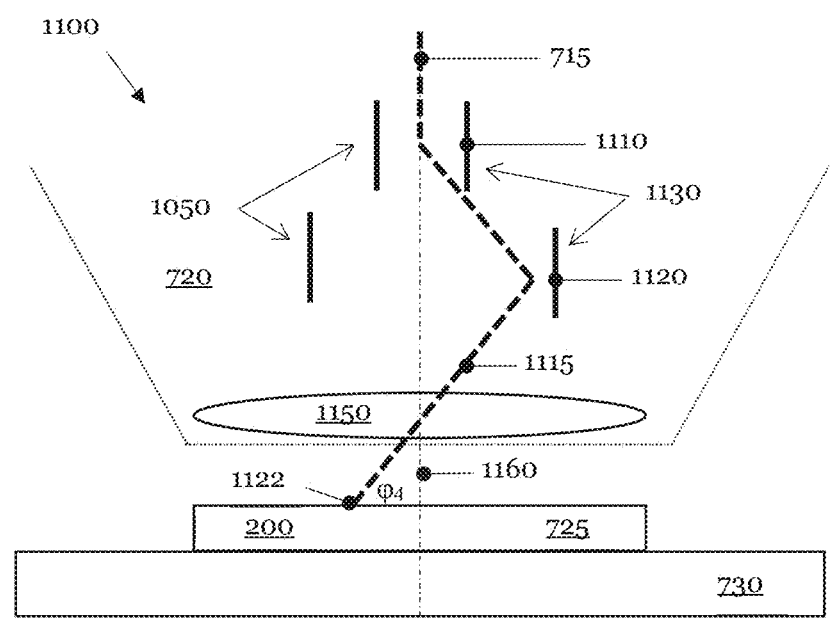
FIG. 11 reproduces a magnified excerpt of the apparatus from FIG. 7 with a deflection apparatus in the form of an electrical deflection system at the specimen-side end of the column of the scanning particle microscope.

FIG. 11 presents a second exemplary embodiment of a deflection apparatus 1050. In the example reproduced in FIG. 11, the deflection apparatus 1050 comprises an electrical deflection system 1130. In FIG. 11, the electrical deflection system 1130 is realized by two additional deflection plate pairs 1110 and 1120, which are installed upstream of the electron-optical objective lens 1150 of the SEM 710 in the column 720 of the latter. The first deflection plate pair 1110 deflects the electron beam 715 from the axis 1160 or the electron-optical axis 1160 of the SEM 710. The second deflection plate pair 1120 is designed and disposed in such a way that the deflected electron beam 1115 substantially passes through the center of the electron-optical objective lens 1150. This beam guidance prevents the deflected electron beam 1115 from suffering significant imaging aberrations on account of the electron-optical objective lens 1150.

What can be gathered from FIG. 11 is that the electron beam 1115 deflected by the electrical deflection system 1130 is incident on the specimen 725 at an angle $\varphi_4$ that is significantly reduced in relation to the angle of incidence from FIG. 7. Moreover, the deflected electron beam 1115 strikes a site 1122 on the surface 815 of the specimen 725 that differs from the point of incidence 722 of the electron beam in FIG. 7. The angle of incidence $\varphi_4$ on the surface 815 of the specimen 725 can be set by varying the voltages that are applied to the deflection plate pairs 1110 and 1120 of the electrical deflection system 1130. Further, the control device 790 can automatically change the mean angle of incidence of the particle beam (410, 715) on the surface of the photolithographic mask 150, 200. The control device 790 can control the electrical deflection system 1130. The evaluation unit 785 can ascertain the settings of the electrical deflection system 1130 on the basis of the repair shape ascertained for a defect.

In the example depicted in FIG. 11, the electrical deflection system 1130 is implemented to deflect the electron beam 715 in a direction with respect to the electron-optical axis 1160. Naturally, the electrical deflection system 1130 can also be designed in such a way that the latter can deflect the electron beam 715, which passes through the deflection system 1130, in two different directions with respect to the electron-optical axis 1160 of the SEM 710.

Further, a magnetic deflection system 1030 and an electrical deflection system 1130 could be combined in one deflection apparatus 1050. Moreover, a tilt apparatus 830 can be used in combination with a deflection apparatus 1050. Moreover, a pivot apparatus 930 could be combined with a deflection apparatus 1050.

Figure 12:
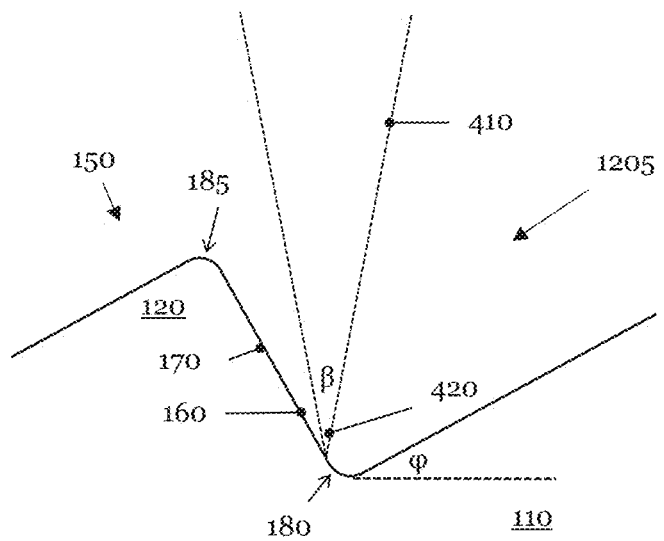
FIG. 12 reproduces FIG. 4, wherein a mean angle of incidence between the time-varying electron beam of the apparatus from FIG. 7 and a surface of a specimen is reduced.
Figure 12:
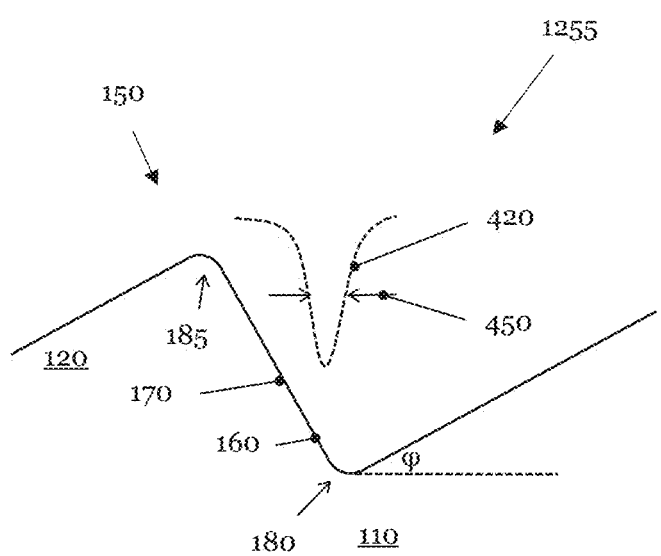
Figure 13:
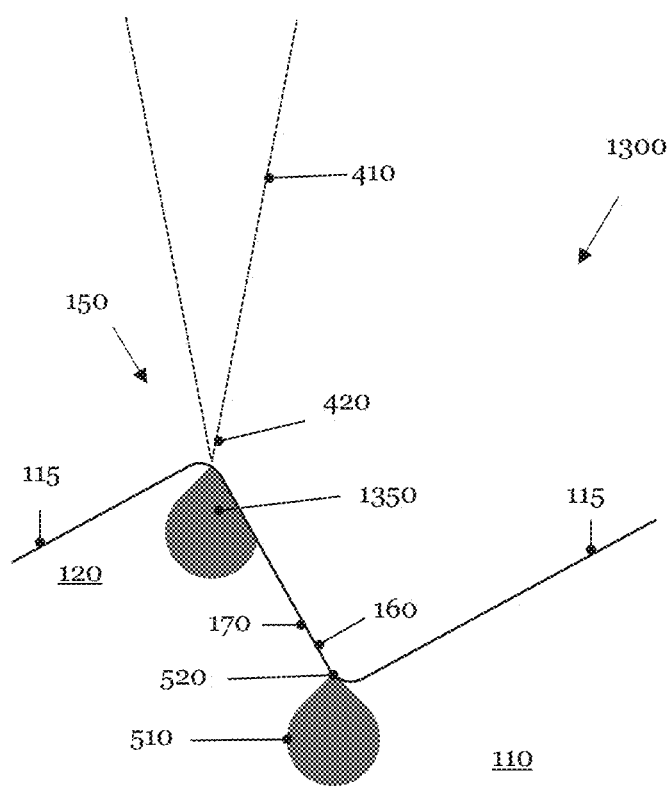
FIG. 13 reproduces the interaction regions from FIG. 5, wherein the mean angle of incidence of the electron beam of the apparatus from FIG. 7 is reduced while a processing process is carried out.

FIGS. 12 and 13 illustrate how the difficulties explained in FIGS. 4 and 5 arising during local processing of a specimen 725, for example of the photomask 150, can be largely removed by reducing the mean angle of incidence of the time-varying particle beam 715 on the surface 815 of the specimen 725. The upper partial image 1205 of FIG. 12 visualizes the incidence of the electron beam 410 on the photolithographic mask 150, the angle of incidence of the electron beam 410 having been reduced by an angle φ in comparison with FIG. 2. Possibilities for reducing the angle of incidence (90°−φ) are explained above in the context of FIGS. 7 to 11. The lower partial image 1255 of FIG. 12 presents—in a manner similar to FIG. 4—the intensity distribution of the electron beam 410 in the focus 420 thereof. As visualized in FIG. 12, reducing the mean angle of incidence (90°−φ) of the electron beam 410 on the surface 115 of the photolithographic mask 150 allows the electron beam 410 to be focused onto a small spot diameter 450 at the focus without the large aperture angle caused thereby being noticeably shadowed by the pattern element 120 of the photomask 150.

Diagram 1300 of FIG. 13 presents interaction regions of the electron beam 410 when processing the side wall 170 or the edge 160 of the photolithographic mask 150, with the mean angle of incidence of the electron beam 410 on the surface 115, 125, 170 of the photomask 150 having been reduced by the angle φ, like in FIG. 12. Reference is made to the explanations relating to FIG. 5 in respect of processing the substrate 110 of the mask 150. Unlike in FIG. 5, the interaction region 1350 is hardly deformed any more when processing the edge 160 or the side wall 170 with the reduced angle of incidence (90°−φ). By way of example, this means that the edge 160 or the side wall 170 can be etched by use of an EBIE process without the slope angle α of the side wall 170 being significantly altered by the local EBIE process. Moreover, the surface 115 of the substrate 110 is not noticeably attacked when the local etching process is carried out.

Figure 14:
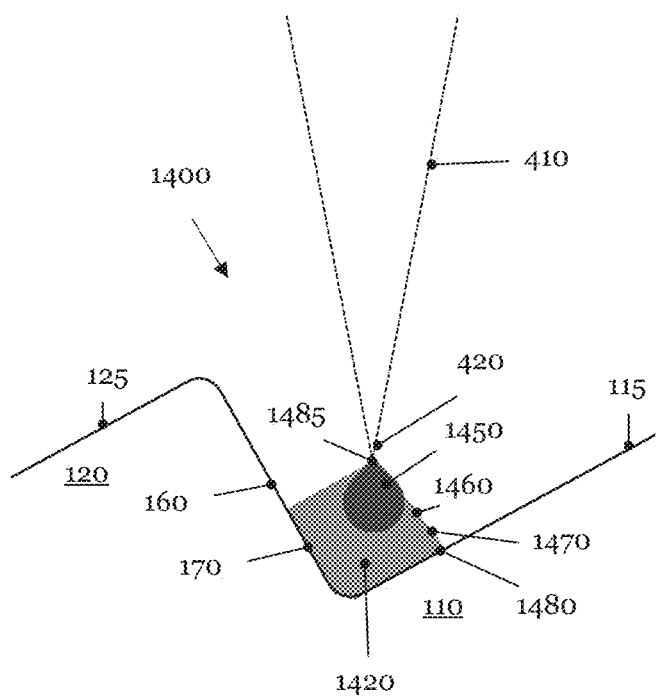
FIG. 14 reproduces the deposition process from FIG. 6, wherein the mean angle of incidence between the particle beam of the apparatus from FIG. 7 and the surface of a photolithographic mask is reduced.

Diagram 1400 of FIG. 14 presents the correction of a defect of missing material by way of the deposition of material 1420 along the side wall 170 of the pattern element 120 on the substrate 110 of the photolithographic mask 150. In contrast to the implementation of the deposition process as explained in FIG. 6, the mean angle of incidence (90°−φ) of the particle beam 410 on the surface 115, 125, 170 of the photomask 150 was reduced—as in FIGS. 12 and 13—before the process started. What can be gathered from FIG. 14 is that the deposit 1420 is deposited with an edge 1460 or a side wall 1470 that deviates slightly from the angle of 90° as predetermined by the design of the photomask 150. However, the deviation is small in comparison with the slope angle of the EBID process explained within the scope of the discussion relating to FIG. 6. Moreover, the radii of curvature 1480 and 1485 are not significantly greater than those of a defect-free pattern element 120 of the photomask 150. Moreover, the deposition process explained within the scope of FIG. 14 deposits substantially no material 1420 on the surface 115 of the substrate 110 of the photolithographic mask 150.

The reduction of the mean angle of incidence between the time-varying particle beam 410, 715 and the surface of the photolithographic mask 830, 930, 1050 by either tilting the sample stage 730, pivoting the column 720 of the SEM 710 and/or by deflecting the particle beam 410, 715 is preferably in a range between 5° and 30°.

In order to obtain steep side walls 170 and small radii of curvature of the repaired photolithographic masks it is beneficial to use small spot sizes of the focused electron beam 410, 715. Presently electron beams 410, 715 can be focused to a spot size in the range of 0.1 nm. However, in order to obtain reasonable processing rates focal diameter in a range of 0.5 nm to 50 nm can be used.

Small spot of the focused electron beam 410, 715 can be obtained by using large aperture angles of the electron beam 410, 715. Preferred aperture angles of the electron beam 410, 715 are in the range of 0.1 mrad to 1000 mrad.

Figure 15:
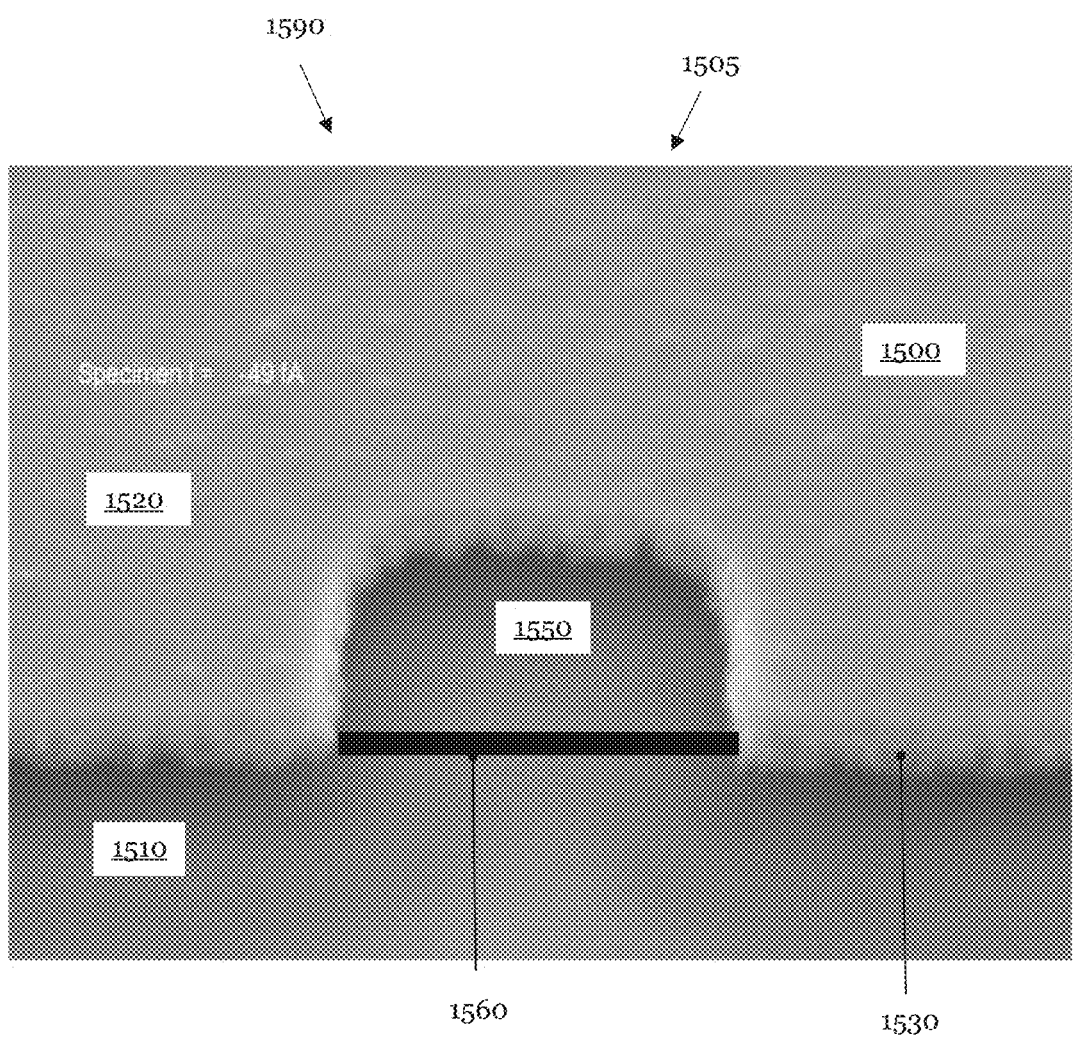
FIG. 15 shows an excerpt of an electron-microscopic recording of a photolithographic mask comprising a pattern element, wherein the pattern element has a missing pattern material defect.

Diagram 1590 of FIG. 15 shows an excerpt 1505 of an electron-microscopic recording of a photolithographic mask 1500. The excerpt 1505 shows an edge 1530 of a pattern element 1520, which is disposed on a substrate 1510 of the mask 1500. The pattern element 1520, and hence the mask 1500, has a defect of missing pattern material 1550. The black bar 1560 specifies the width of the scan region of the electron beam 715, which is used to repair the defect 1550. The defect of missing pattern material 1550 is corrected by depositing material in the defective region 1550, the deposited material having optical properties that are as close as possible to the material of the pattern element 1520.

Figure 16:
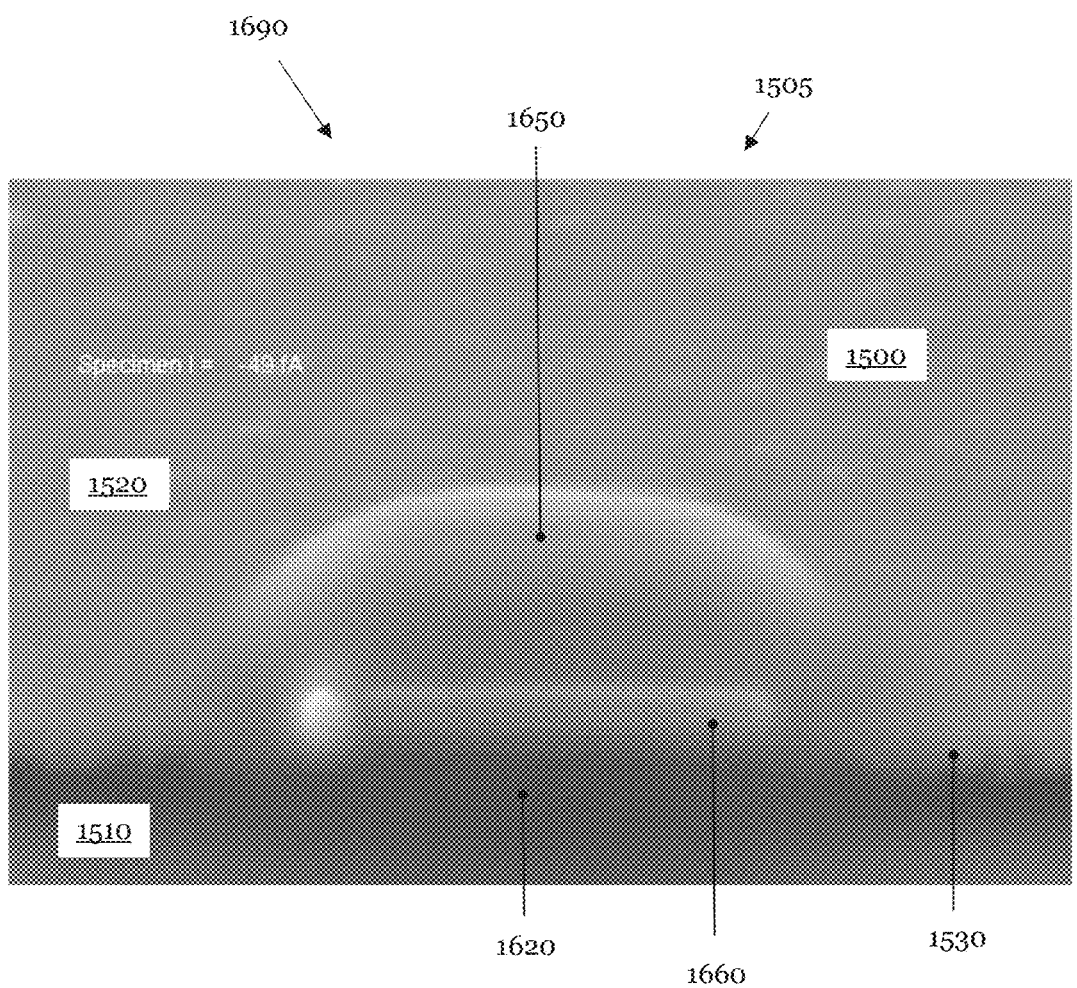
FIG. 16 depicts the excerpt from FIG. 15 after repairing the missing pattern material defect.

Diagram 1690 of FIG. 16 presents an electron-microscopic recording of the excerpt 1505 of the photolithographic mask 1500 following the repair of the defect of missing pattern material 1550. The defect 1550 was repaired by depositing material by use of an EBID process. For the purposes of initiating the local electron beam-induced deposition process, the electron beam 410 was not directed on the defective site 1550 in perpendicular fashion but obliquely from the front such that the mean angle of incidence of the electron beam 715 on the surface 115 of the substrate 1510 was less than 90°. The electron beam 410 was likewise incident on the photolithographic mask 1500 obliquely from the front when the excerpt 1505 was recorded. The repaired defect 1550 is labelled by the reference sign 1660 in FIG. 16. The edge 1530 of the pattern element 1520 is delineated less sharply in FIG. 16 than in FIG. 15.

What can be gathered from FIG. 16 is that the EBID process for repairing the defect 1550 has deposited hardly any material on the substrate 1510 in the region 1620 in front of the defective site of the photolithographic mask 1500. Therefore, the transmission of the substrate 1510 of the mask 1500 is not impaired by the repair process.

However, it can be clearly identified from FIG. 16 that the repair process for the defect 1550 has deposited significant amounts of material on the pattern element 1520. This is evident in FIG. 16 from the halo labelled by the reference sign 1650.

Should the pattern element 1520 be a pattern element of a binary photomask 1500, as is the case for the photomask 1500 illustrated in FIGS. 15 and 16 in exemplary fashion, the additional absorber material of the halo 1650 on the pattern element does not impair the function of the photolithographic mask 1500.

By contrast, should the pattern element 1520 be a structure element 1520 of a phase-shifting mask, the halo 1650 produced by the repair process would significantly impair the repaired photomask. In order to prevent this, the pattern element 1520 can be covered by a temporary protective layer in the region of the halo 1650 before the EBID process for repairing the defect of missing pattern material 1550 is carried out (not illustrated in FIG. 16). A temporary protective layer can likewise be deposited with the aid of a particle beam-induced deposition process. A material or material composition is chosen as a material for the temporary protective layer such that the temporary protective layer can easily be removed from the repaired photolithographic mask 1500 together with the material, situated on said temporary protective layer, which was deposited for repairing the defect. A temporary protective layer can be removed by carrying out an EBIE process using the apparatus 700. Alternatively, a protective layer can be implemented, for example, within the scope of a cleaning process for the photolithographic mask 1500, for instance by wet-chemical cleaning.

Figure 17:
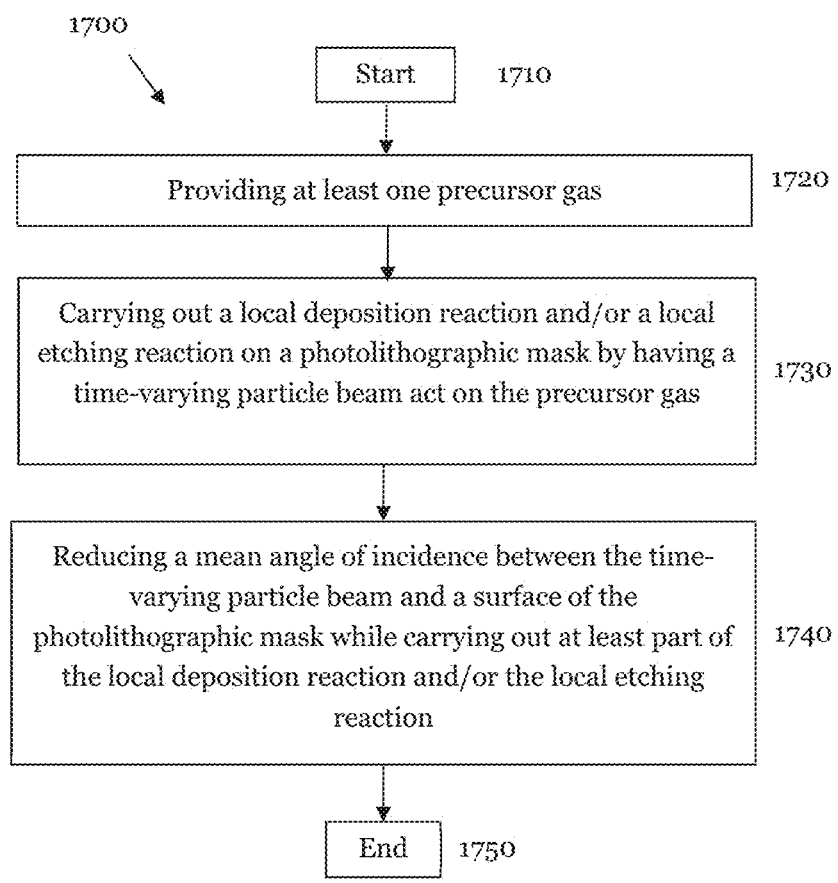
FIG. 17 specifies a flowchart of the method for processing a photolithographic mask.

Finally, the flowchart 1700 of FIG. 17 presents essential steps of the method for processing a photolithographic mask 150, 200, 1500 in compact form. The method begins in step 1710. At least one precursor gas is provided in the next step 1720. One or more precursor gases can be stored in one of the supply containers 740, 750, 760 of the apparatus 700 and can be guided by use of a gas feedline system 745, 755, 765 to the location where the electron beam 410, 710 is incident on a specimen 725. Thereupon, a local deposition reaction and/or a local etching reaction on the photolithographic mask 150, 200, 1500 is carried out in step 1730 by having a time-varying particle beam 410, 710 acting on the precursor gas. A mean angle of incidence between the time-varying particle beam 410, 710 and a surface 115 of the photolithographic mask 150, 200, 1500 is reduced in step 1740 while carrying out at least part of the local deposition reaction and/or the local etching reaction. The method ends in step 1750.

In some implementations, the computer system 780 can include one or more data processors for processing data, one or more storage devices for storing data, such as one or more databases, and/or one or more computer programs including instructions that when executed by the computer system causes the computer system to carry out the computations or processes described above. The computer system can include one or more input devices, such as a keyboard, a mouse, a touchpad, and/or a voice command input module, and one or more output devices, such as a display, and/or an audio speaker. The computer system can show graphical user interfaces on the display to assist the user of the error correction apparatus.

In some implementations, the computer system 780 can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively, or additionally, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer system 780 is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for processing a photolithographic mask described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. An apparatus for processing a photolithographic mask, the apparatus comprising:
    a. at least one time-varying particle beam, which is embodied for a local deposition reaction and/or a local etching reaction on the photolithographic mask;
    b. at least one first means for providing at least one precursor gas, wherein the precursor gas is embodied to interact with the particle beam during the local deposition reaction and/or the local etching reaction;
    c. at least one second means, which reduces a mean angle of incidence ($\varphi$) between the time-varying particle beam and a surface of the photolithographic mask;
    d. an evaluation unit embodied to determine at least one reduction in the mean angle of incidence ($\varphi$) of the particle beam on the photolithographic mask from analysed scan data;
    e. a control device configured to control the at least one second means to reduce the mean angle of incidence ($\varphi$) between the time-varying particle beam and the surface of the photolithographic mask; and
    f. the control device being further configured to control the time-varying particle beam to interact with the at least one precursor gas to carry out the local deposition reaction and/or the local etching reaction;
    g. wherein the control device is configured to control the at least one second means to reduce the mean angle of incidence ($\varphi$) at each of a plurality of points on the surface of the photolithographic mask while using the time-varying particle beam to interact with the at least one precursor gas to carry out the local deposition reaction and/or the local etching reaction.

2. The apparatus of claim 1, wherein the second means comprises at least one element from the group:
    a tilt apparatus for tilting the photolithographic mask relative to the particle beam;
    a pivot apparatus of a beam source for tilting the particle beam relative to the photolithographic mask; and
    at least one deflection apparatus for particles of the particle beam, for reducing the mean angle of incidence ($\varphi$) of the particle beam on the photolithographic mask.

3. The apparatus of claim 2, wherein the deflection apparatus comprises at least one element from the group: an electrical deflection system and a magnetic deflection system.

4. The apparatus of claim 2, wherein the at least one deflection apparatus is part of the beam source of the particle beam.

5. The apparatus of claim 2, wherein the at least one deflection apparatus is not part of the beam source of the particle beam.

6. The apparatus of claim 3, wherein the electrical deflection system comprises at least one deflection plate pair.

7. The apparatus of claim 3, wherein the magnetic deflection system comprises at least one coil arrangement.

8. The apparatus of claim 2, wherein the tilt apparatus comprises a specimen stage for the photolithographic mask, said specimen stage being rotatable about at least two axes, and wherein the two axes lie in a plane of the photolithographic mask and are not parallel to one another.

9. The apparatus of claim 1, wherein the second means reduces the mean angle of incidence between the time-varying particle beam and the surface of the photolithographic mask by >5°.

10. The apparatus of claim 1, wherein the particle beam at the point of incidence on the photolithographic mask has a focal diameter of 0.1 nm to 1000 nm.

11. The apparatus of claim 1, wherein the particle beam has an aperture angle of 0.1 mrad to 1000 mrad.

12. The apparatus of claim 1, wherein the evaluation unit is embodied to analyze scan data of a site to be processed on the photolithographic mask.

13. The apparatus of claim 1, wherein the control device is configured to control the at least one second means to make multiple adjustments at multiple local processing sites on the photolithographic mask to reduce the mean angle of incidence ($\varphi$) between the time-varying particle beam and the surface of each local processing site on the photolithographic mask while using the time-varying particle beam to interact with the precursor gas to carry out the local deposition reaction and/or the local etching reaction at the first local processing site.

14. The apparatus of claim 1, wherein the at least one time-varying particle beam scans a local processing site to obtain the scan data.

15. An apparatus for processing a photolithographic mask, the apparatus comprising:
- a particle beam source configured to generate at least one time-varying particle beam for a local deposition reaction and/or a local etching reaction on the photolithographic mask;
- at least one precursor gas supply configured to provide at least one precursor gas to interact with the particle beam during the local deposition reaction and/or the local etching reaction, the at least one precursor gas supply comprising at least one container for containing the at least one precursor gas and at least one control valve to control a flow rate of the at least one precursor gas;
- a mean angle of incidence adjustment module configured to adjust a mean angle of incidence ($\varphi$) between the time-varying particle beam and a surface of the photolithographic mask, in which the mean angle of incidence adjustment module comprises at least one of (i) a motor or actuator configured to tilt the photolithographic mask relative to the particle beam, (ii) a motor or actuator configured to pivot the particle beam source to tilt the particle beam relative to the photolithographic mask, or (iii) at least one deflection apparatus configured to deflect the particles of the particle beam;
- an evaluation unit embodied to determine at least one reduction in the mean angle of incidence ($\varphi$) of the particle beam on the photolithographic mask from analysed scan data; and
- a control device configured to control the mean angle of incidence adjustment module to reduce the mean angle of incidence ($\varphi$) between the time-varying particle beam and the surface of the photolithographic mask and the time-varying particle beam to interact with the at least one precursor gas to carry out the local deposition reaction and/or the local etching reaction.

16. The apparatus of claim 15, wherein the evaluation unit is configured to analyze scan data of a site to be processed on the photolithographic mask.

* * * * *

UNITED STATES PATENT AND TRADEMARK OFFICE
CERTIFICATE OF CORRECTION

PATENT NO. : 11,256,168 B2
APPLICATION NO. : 16/775719
DATED : February 22, 2022
INVENTOR(S) : Michael Budach and Ottmar Hoinkis It is certified that error appears in the above-identified patent and that said Letters Patent is hereby corrected as shown below:

In the Specification

Column 11
Line 65, delete "EIBD" and insert -- EBID --

Column 19
Line 41, delete "angle" and insert -- angle β --

Signed and Sealed this
Eleventh Day of October, 2022

Katherine Kelly Vidal
*Director of the United States Patent and Trademark Office*